US011217447B2

(12) United States Patent
Thomas

(10) Patent No.: US 11,217,447 B2
(45) Date of Patent: Jan. 4, 2022

(54) METHOD OF PRODUCING A TWO-DIMENSIONAL MATERIAL

(71) Applicant: Paragraf Ltd., Somersham (GB)

(72) Inventor: Simon Charles Stewart Thomas, Peterborough (GB)

(73) Assignee: Paragraf Ltd., Somersham (GB)

( * ) Notice: Subject to any disclaimer, the term of this patent is extended or adjusted under 35 U.S.C. 154(b) by 78 days.

(21) Appl. No.: 16/795,841

(22) Filed: Feb. 20, 2020

(65) Prior Publication Data

US 2020/0194255 A1  Jun. 18, 2020

Related U.S. Application Data

(63) Continuation of application No. 15/752,694, filed as application No. PCT/GB2016/052003 on Jul. 1, 2016, now Pat. No. 10,593,546.

(30) Foreign Application Priority Data

Aug. 14, 2015  (GB) ..................................... 1514542
Oct. 30, 2015  (GB) ..................................... 1519182
(Continued)

(51) Int. Cl.
   C30B 25/10      (2006.01)
   H01L 21/02      (2006.01)
   (Continued)

(52) U.S. Cl.
   CPC ........ H01L 21/0262 (2013.01); C01B 32/186 (2017.08); C23C 16/24 (2013.01);
   (Continued)

(58) Field of Classification Search
   CPC ... C23C 16/24; C23C 16/26; C23C 16/45572; C30B 25/10; C30B 25/14; C30B 25/16;
   (Continued)

(56) References Cited

U.S. PATENT DOCUMENTS 5,709,745 A    1/1998  Larkin et al.
5,871,586 A    2/1999  Crawley et al.
                (Continued)

FOREIGN PATENT DOCUMENTS

CN    102001650 A    4/2011
CN    1025860414    7/2012
                (Continued)

OTHER PUBLICATIONS

Combined Search and Examination Report Under Sections 17 & 18(3) for Application No. GB1907412.9, dated Jul. 22, 2019.
(Continued)

*Primary Examiner* — Robert M Kunemund
(74) *Attorney, Agent, or Firm* — Stinson LLP

(57) ABSTRACT

A method of producing graphene or other two-dimensional material such as graphene including heating the substrate held within a reaction chamber to a temperature that is within a decomposition range of a precursor, and that allows two-dimensional crystalline material formation from a species released from the decomposed precursor; establishing a steep temperature gradient (preferably >1000° C. per meter) that extends away from the substrate surface towards an inlet for the precursor; and introducing precursor through the relatively cool inlet and across the temperature gradient towards the substrate surface. The steep temperature gradient ensures that the precursor remains substantially cool until it is proximate the substrate surface thus minimizing decomposition or other reaction of the precursor before it is proximate the substrate surface. The separation between the precursor inlet and the substrate is less than 100 mm.

22 Claims, 4 Drawing Sheets

US 11,217,447 B2
Page 2

(30) Foreign Application Priority Data

Dec. 30, 2015 (GB) .................................... 1523083
Jun. 15, 2016 (GB) .................................... 1610467

(51) Int. Cl.

| | | |
|---|---|---|
| *C30B 29/02* | (2006.01) | |
| *C30B 29/06* | (2006.01) | |
| *C30B 25/16* | (2006.01) | |
| *C30B 29/60* | (2006.01) | |
| *C23C 16/26* | (2006.01) | |
| *C23C 16/24* | (2006.01) | |
| *C01B 32/186* | (2017.01) | |
| *C23C 16/455* | (2006.01) | |
| *C30B 25/14* | (2006.01) | |
| *C30B 29/40* | (2006.01) | |

(52) U.S. Cl.
CPC ........ *C23C 16/26* (2013.01); *C23C 16/45572* (2013.01); *C30B 25/10* (2013.01); *C30B 25/14* (2013.01); *C30B 25/16* (2013.01); *C30B 29/02* (2013.01); *C30B 29/06* (2013.01); *C30B 29/403* (2013.01); *C30B 29/406* (2013.01); *C30B 29/60* (2013.01); *H01L 21/0254* (2013.01); *H01L 21/0257* (2013.01); *H01L 21/02521* (2013.01); *H01L 21/02527* (2013.01); *H01L 21/02532* (2013.01); *H01L 21/0242* (2013.01); *H01L 21/02378* (2013.01); *H01L 21/02381* (2013.01); *H01L 21/02389* (2013.01); *H01L 21/02392* (2013.01); *H01L 21/02395* (2013.01); *H01L 21/02398* (2013.01); *H01L 21/02403* (2013.01); *H01L 21/02422* (2013.01)

(58) Field of Classification Search
CPC ..... C30B 29/02; C30B 29/403; C30B 29/406; C30B 29/60
See application file for complete search history.

(56) References Cited

U.S. PATENT DOCUMENTS

| | | | |
|---|---|---|---|
| 6,063,185 | A | 5/2000 | Hunter |
| 8,343,594 | B2 | 1/2013 | Hasebe et al. |
| 2005/0012089 | A1 | 1/2005 | Senzaki et al. |
| 2005/0106319 | A1 | 5/2005 | Jurgensen et al. |
| 2005/0178336 | A1 | 8/2005 | Liu |
| 2007/0141258 | A1 | 6/2007 | Fareed et al. |
| 2008/0308036 | A1 | 12/2008 | Ito et al. |
| 2010/0263588 | A1 | 10/2010 | Zhiyin |
| 2011/0033688 | A1 | 2/2011 | Veerasamy |
| 2011/0303899 | A1 | 12/2011 | Padhi et al. |
| 2012/0269717 | A1 | 10/2012 | Radhakrishnan et al. |
| 2013/0052121 | A1 | 2/2013 | Hasegawa et al. |
| 2014/0255705 | A1 | 9/2014 | Nepal et al. |
| 2015/0098891 | A1 | 4/2015 | Song et al. |
| 2015/0329765 | A1 | 11/2015 | Hendry et al. |
| 2016/0207291 | A1 | 7/2016 | Dimitrakopoulos et al. |

FOREIGN PATENT DOCUMENTS

| | | | |
|---|---|---|---|
| CN | 203096166 | U | 7/2013 |
| CN | 103590100 | | 2/2014 |
| CN | 104409319 | | 3/2015 |
| CN | 104465724 | A | 3/2015 |
| CN | 104562195 | A | 4/2015 |
| CN | 104695012 | A | 6/2015 |
| DE | 102013111791 | A1 | 4/2015 |
| JP | H08279506 | A | 10/1996 |
| JP | 3222723 | | 10/2011 |
| JP | 2011207736 | A | 10/2011 |
| JP | 2012082093 | A | 4/2012 |
| JP | 2013173660 | A | 9/2013 |
| JP | 2013177273 | A | 9/2013 |
| JP | 2015034102 | A | 2/2015 |
| WO | 2014097280 | | 6/2014 |
| WO | 2014104973 | | 7/2014 |
| WO | 2014110170 | | 7/2014 |
| WO | 2014182540 | | 11/2014 |

OTHER PUBLICATIONS

Sukang Bae et al., "Roll-to-roll production of 30-inch graphene films for transparent electrodes," Jun. 20, 2010.
Combined Search and Examination Report Under Sections 17 & 18(3) for Application No. GB1907417.8, dated Jul. 22, 2019.
Intellectual Property Office of Singapore Search Report for Application No. 11201800946P, dated Mar. 14, 2019.
Communication Pursuant to Article 94(3) EPC for Application No. 16736599.8, dated Oct. 21, 2019.
Wei Liu et al., "Synthesis of high-quality monolayer and bilayer graphene on copper using chemical vapor deposition," May 30, 2011.
Li Tao et al., "Uniform Wafer-Scale Chemical Vapor Deposition of Graphene on Evaporated Cu (111) Film with Quality comparable to Exfoliated Monolayer," The Journal of Physical Chemistry, Nov. 11, 2012.
Li Tao et al., "Uniform Wafer-Scale Chemical Vapor Deposition of Graphene on Evaporated Cu (111) Film with Quality comparable to Exfoliated Monolayer," Supporting Information, Nov. 15, 2012.
PCT International Search Report for International Application No. PCT/GB2016/052003, dated Nov. 30, 2016.
Meng-Yu Lin et al., "The growth mechanism of graphene directly on sapphire substrates by using the chemical vapor deposition," Journal of Applied Physics, American Institute of Physics, US, vol. 115, No. 22, Jun. 14, 2014.
Qing S. Paduano et al., "Self-terminating growth in hexagonal boron nitride by metal organic chemical vapor deposition," Applied Physics Express, vol. 7, No. 7, p. 071004, Jun. 24, 2014.
E. Raj et al., "Modelling of MOCVD Reactor: New 3D Approach", Journal of Physics: Conference Series, Institute of Physics Publishing, Bristol, GB, vol. 494, No. 1, p. 12019, Apr. 4, 2014.
Tao et al., "Synthesis of High Quality Monolayer Graphene at Reduced Temperature on Hydrogen-Enriched Evaporated Copper (111) Films," ACS Nano, 2012, vol. 6, No. 3, pp. 2319-2325.

METHOD OF PRODUCING A TWO-DIMENSIONAL MATERIAL

CROSS-REFERENCE TO RELATED APPLICATIONS

This application is a continuation of U.S. Nonprovisional patent application Ser. No. 15/752,694, filed 14 Feb. 2018, now U.S. Pat. No. 10,593,546, which is the 371 National Stage Application based on PCT Patent Application No. PCT/GB2016/052003 filed on 1 Jul. 2016, which is based upon and claims priority to GB Patent Application No. 1514542.8 filed on 14 Aug. 2015, and to GB Patent Application No. 1519182.8 filed on 30 Oct. 2015, and to GB Patent Application No. 1523083.2 filed on 30 Dec. 2015, and to GB Patent Application No. 1610467.1 filed on 15 Jun. 2016; the collective disclosure of which being hereby incorporated by reference in its entirety.

BACKGROUND

The present invention relates to a method of producing a two-dimensional material particularly but not exclusively graphene and silicene. The invention also relates to a method of producing heterostructures comprising two-dimensional materials.

Graphene is a well-known material with a plethora of proposed applications driven by the material's theoretical extraordinary properties. Good examples of such properties and applications are detailed in 'The Rise of Graphene' by A. K. Geim and K. S. Novoselev, Nature Materials, vol. 6, March 2007, 183-191.

Nevertheless, to achieve these desired material properties and applications, it is well understood that it is essential for the graphene to have a number of characteristics including:

i. Very good crystal quality, namely that the graphene structure lattice is extremely uniform about all axes, highly repeatable in symmetry throughout the full monolayer and exhibits minimal lattice malformations;

ii. Large material grain size, whereby the grain structure of grown graphene exhibits individual grain dimensions ≥10 μm×10 μm;

iii. Minimal material defects, whereby defects include crystal lattice breaks, interruptions, atomic or molecular contamination to the crystal from other elements, or poor graphene monolayer surface condition through, for example oxidation;

iv. Large sheet size, i.e. greater than 3 cm×3 cm and preferably in the order of 10 s of centimeters; and v. Be self supporting so that a complete sheet of the size given in iv above can be removed intact from the substrate upon which it was produced.

Conventional graphene production methodologies to date have been unable to manufacture graphene with all of the aforementioned properties. Consequently, the predicted performance properties and device applications of graphene have yet to be realized.

Several conventional methods of graphene production exist and are in wide use; examples are described in:

US 20130156678 A1—solution based electrophoresis of graphene on metallic substrates or films, whereby an electrical potential is applied to a conductive substrate immersed in carbon comprising solution. The result is carbon transport, due to the applied field, to the substrate surface at which point self alignment of the carbon into graphene 'sheets' occurs;

U.S. Pat. No. 8,147,791 B2—a graphene oxide reduction mechanism whereby graphene oxide is introduced to a water and solvent solution and heated to moderate (<300° C.) temperature resulting in the dissociation of oxygen and allowing carbon amalgamation, potentially in graphene crystal structure configuration;

WO 2014110170 A1—a catalysis driven chemical vapor deposition (CVD) technique whereby a heated copper substrate is used as a catalytic surface in a standard CVD chamber for the decomposition of hydrocarbons resulting in carbon being left on the metallic surface.

Beyond the current inability to achieve the important material properties described above, further limitations exist to these conventional techniques.

The need of special sacrificial metal catalyst substrates to promote graphene formation introduces limitations to the production process parameters. Examples of these limitations include the need to use temperatures that do not affect phase changes in the metal substrates and the need to use non-reducing gases and precursors that will not degrade the metallic substrate surface. This inflexibility in production variables has lead, in certain processes, to difficulty to achieve good graphene growth and the inability to remove unintended contamination or dopants.

In current processes, the graphene grains formed are not sufficiently bonded to maintain sheet form once removed from the substrate. Consequently, graphene is most commonly available in the form of flakes or powder, or sheets that comprise a protective fixant that retains the grains together. The protective fixant renders the sheet unsuitable for electronic device construction.

Two further problems with the conventional production methodologies derive from the need to:

a) remove the produced graphene from the equipment to make an electronic device, thus exposing the graphene to the external environment resulting in surface contamination that adversely affects the further processes required to produce the electronic device; and b) separation of the graphene from the catalyst metal base substrate which requires chemical or physical processes that contaminate the graphene material.

Since the proposal of graphene, additional two dimensional (2D) layers, often termed single layer materials, have been speculated and are now being researched extensively at a rate that now exceeds new research into graphene. Such materials include Silicene, Phosphorene, Borophene, Germanene and Graphyne allotropes of Silicon, Phosphor, Boron, Germanium and Carbon respectively. As with graphene these materials will theoretically exhibit extraordinary properties particularly suited to next generation electronics as outlined in "Electronics based on two-dimensional materials", Nature Nanotechnology, 2014 (9), 768-779.

In all cases, the realization and hence efficient manufacturing of these materials still remains theoretical although several approaches have been potentially identified, as described in 'Progress, Challenges, and Opportunities in Two-Dimensional Materials Beyond Graphene' (ACS Nano, 2013, 7 (4), 2898-2926. The issues are largely similar to those detailed above for graphene production, however, other 2D materials, unlike graphene, are inherently unstable in air which demands production in inert environments.

Until now, no techniques exist, beyond delaminating single monolayers from bulk materials in nitrogen environments, to produce other 2D materials and no single layers or structures have been successfully produced that survive outside of the controlled inert environment.

The main target applications for 2D materials lie with the combination of these monolayers with semiconductor or dielectric materials in electronic and photonic structures and devices. A plethora of potential inventions have been theorized and speculated, as well detailed in "Science and Technology Roadmap for Graphene, Related Two-Dimensional Crystals, and hybrid systems", Nanoscale 11, 2015.

Several prototype structures have been realized physically through the manual combination of very small samples, less than 1 cm², of individual graphene and semiconductor material samples, however the performance of these structures is well below the predicted properties due to the poor quality of the graphene), the manual combination techniques and the inherent contamination that occurs due to the assembly procedure.

The present invention was conceived with the aim of overcoming or at least ameliorating the above problems.

BRIEF SUMMARY

According to a first aspect of the invention there is provided a method of producing a two-dimensional crystalline material, the method may comprise: providing a substrate with a surface having nucleation sites within a reaction chamber. The method may also comprise introducing a precursor into the reaction chamber, the precursor being in a gas phase and/or suspended in a gas; and heating the substrate to a temperature that is within a decomposition range of the precursor, and that allows two-dimensional crystalline material formation from a constituent released from the decomposed precursor. The method preferably comprises cooling the precursor entry point. The reaction chamber may be a close coupled reaction chamber. A separation may be provided between the substrate surface upon which the two-dimensional crystalline material is formed and the point at which the precursor enters the reaction chamber that is sufficiently small, and a thermal gradient between the substrate surface and the point at which the precursor enters the chamber that is sufficiently steep, that the fraction of precursor that reacts in the gas phase within the reaction chamber is low enough to allow the formation of the two-dimensional crystalline material.

According to a further aspect of the invention there is provided a method of producing a two-dimensional crystalline material, the method comprising: providing a substrate having nucleation sites within a close coupled reaction chamber;

introducing a precursor into the close coupled reaction chamber, the precursor being in a gas phase and/or suspended in a gas; and heating the substrate to a temperature that is within a decomposition range of the precursor, and that allows two-dimensional crystalline material formation from a species released from the decomposed precursor.

A close coupled reaction chamber provides a separation between the substrate surface upon which the two-dimensional crystalline material is formed and the entry point at which the precursor enters the close coupled reaction chamber that is sufficiently small that the fraction of precursor that reacts in the gas phase within the close coupled reaction chamber is low enough to allow the formation of two-dimensional crystalline material. The upper limit of the separation may vary depending upon the precursor chosen, substrate temperate and pressure within the close coupled reaction chamber.

Compared with the chamber of a standard CVD system, the use of a close coupled reaction chamber, which provides the aforementioned separation distance, allows a high degree of control over the supply of the precursor to the substrate; the small distance provided between the substrate surface on which the two-dimensional crystalline material is formed and the inlet through which the precursor enters the close coupled reaction chamber, allows for a steep thermal gradient thereby providing a high degree of control over the decomposition of the precursor.

In many instances the separation between the substrate surface upon which the two-dimensional crystalline material is formed and the chamber wall directly opposite the substrate surface will be substantially equal to the separation between the substrate surface and the point at which the precursor enters the close coupled reaction chamber. Nevertheless, this may not necessarily be the case, for example, where the close coupled reaction chamber comprises an inlet for precursor that sits/extends within the chamber or where a horizontal introduction type chamber is used.

The relatively small separation between the substrate surface and the chamber wall provided by a close coupled reaction chamber, compared with the relatively large separation provided by a standard CVD system allows:

1) a steep thermal gradient between the precursor's entry point and the substrate surface;

2) a short flow path between the precursor entry point and the substrate surface; and 3) a close proximity of the precursor entry point and the point of two-dimensional crystalline material formation.

These benefits enhance the effects that deposition parameters including substrate surface temperature, chamber pressure and precursor flux have on the degree of control over the delivery rate of the precursor to the substrate surface and the flow dynamics across the substrate surface.

These benefits and the greater control provided by these benefits enable minimization of gas phase reactions within the chamber, which are detrimental to two-dimensional crystalline material deposition; allow a high degree of flexibility in the precursor decomposition rate, enabling efficient delivery of the species to the substrate surface; and gives control over the atomic configuration at the substrate surface which is impossible with standard CVD techniques.

The refined control of the environment at and around the substrate surface available through use of a close coupled reaction chamber enables the deposition of two-dimensional crystalline material using, for example vapor phase epitaxy (VPE). This, together with the benefits provided by a steep thermal gradient lead to the ability to deposit two-dimensional crystalline material without the need to use a metallic catalytic substrate.

By removing the need for a metallic catalytic substrate there is provided increased flexibility in the process conditions that can be used to produce two-dimensional crystalline material. This in turn offers the possibility of limiting unintentional doping and increasing grain size. It also allows the choice of using substrates to which the two-dimensional crystalline material adheres less well, i.e. is poorly bonded, facilitating separation of the two-dimensional crystalline material by more straightforward and quicker processes that result in minimal or no contamination of the two-dimensional crystalline material.

In one preferred embodiment the two-dimensional crystalline layer is graphene, the precursor is a carbon comprising precursor and the species is carbon.

Using the method of the invention it has been possible to produce graphene with substantially improved properties over known methods, for example with a grain size greater than 20 µm, covering a substrate of 6 inch diameter with 98% coverage, a layer uniformity of >95% of the substrate, sheet resistivity less than 4500/sq and electron mobility greater than 2435 cm$^2$/Vs. The most recent tests on a graphene layer produced using the method of the invention have demonstrated electron mobility >8000 cm$^2$/Vs across the full layer tested at standard conditions for temperature and pressure. The method has been able to produce graphene layers across a substrate of 6 inches (15 cm) having undetectable discontinuity, measured by standard Raman and AFM mapping techniques to micron scale. The method has also shown to be able to produce a uniform graphene monolayer and stacked uniform graphene layers across the substrate without formation of additional layer fragments, individual carbon atoms or groups of carbon atoms on top of the or uppermost uniform monolayer.

In another embodiment the two-dimensional crystalline layer is silicene, the precursor is a silicon comprising precursor and the species is silicon.

The preferred temperature to which the substrate is heated is dependent upon the precursor selected. The temperature selected needs to be high enough to allow at least partial decomposition of the precursor in order to release the species, but preferably not so high as to promote increased recombination rates in the gas phase away from the substrate surface and hence production of unwanted by-products. A complete decomposition temperature, whereby 100% of precursor is decomposed, is typically available from the precursor supplier or can be found in one of many online databases. Recombination rates can be theoretically calculated once other process conditions have been selected, for example reaction chamber pressure and precursor flow rate, using well known methods known to the person skilled in the art. Notwithstanding, the selected temperature may be higher than the complete decomposition temperature to promote improved substrate surface kinetics and so encourage formation of two-dimensional crystalline material with good crystal quality. There can be a trade off in selecting a temperature that provides good crystal quality at the cost of a higher recombination rate and thus lower two-dimensional crystalline material growth rate. It is possible to determine a best temperature, or preferred temperature range, for a specific precursor through straightforward empirical experimentation.

The temperature range for deposition of two-dimensional crystalline material in a close coupled reactor is dependent on the chosen substrate material, the chosen species comprising (and/or where applicable dopant) precursor and the desired final graphene properties. VPE two-dimensional crystalline material deposition temperature can range from 200° C. when using highly volatile precursors with low decomposition temperatures, up to 1500° C. for other precursor compounds.

It is tacit that in order for there to be a thermal gradient between the substrate surface and the introduction point for precursor, the inlet will need to be of a lower temperature than the substrate. For a fixed separation a greater temperature difference will provide a steeper temperature gradient. As such it is preferred that at least the wall of the chamber through which the precursor is introduced, and more preferably the walls of the chamber are cooled. Cooling may be achieved using a cooling system, for example, using fluid, preferably liquid, most preferably water, cooling. The reactor's walls may be maintained at constant temperature by water cooling. The cooling fluid may flow around the inlet(s) to ensure that the temperature of the inner surface of the reactor wall through which the inlets extend, and thus of the precursor itself as it passes through the inlet and into the reaction chamber, is substantially lower than the substrate temperature, favorably equal to or under 200° C., 170° C. or below being more preferred.

In arrangements in which the inlet is defined by a conduit that protrudes into the chamber by a meaningful amount, it is likely to be necessary to provide fluid cooling by running cooling fluid across and/or though the protruding conduit wall in order that the precursor within the protrusion is kept cool until it passes out of the inlet. As a consequence of the added complexity caused by this, an arrangement including a protruding conduit is not preferred.

Through both simultaneously heating the substrate and providing cooling the wall of the reactor directly opposite the substrate surface at the inlet, a steep thermal gradient can be formed whereby the temperature is a maximum at the substrate surface and drops rapidly towards the inlet. This ensures the reactor volume above the substrate surface has significantly lower temperature than the substrate surface itself, largely reducing probability of precursor reaction, in the none useful gas phase, until the precursor is proximate the substrate surface.

Although the temperature profile across the spacing is not in actuality linear, it is preferred that the temperature difference between the substrate and the precursor inlet is equivalent to a linear gradient greater than approximately 1000° C. per meter, $(t_s-t_i)/s > 1000°$ Cm$^{-1}$, where $i_s$ is the temperature of the substrate surface, t, is the temperature at the inlet and s is the spacing in meters.

Such a gradient could be obtained, for example, using a temperature drop of 30° C. across a ~30 mm spacing between the inlet and the substrate. More preferably the temperature difference is equal or greater than 3000° C. per meter, for example using a substrate temperature of 500° C. inlet temperature of 200° C. (difference 300° C.) with a spacing of 100 mm. Even more favorably the difference is over 10,000, which would be achieved, for example using a substrate temperature of 1100° C., inlet temperature of 200° C. and a spacing of 60 mm—equating to ~14,500° C. m$^{-1}$, or a substrate temperature of 500° C. inlet temperature of 200° C. (difference 300° C.) with a spacing of 10 mm (30,000° C. m$^{-1}$).

In a preferred embodiment the method comprises passing the precursor, which may be in a gas phase, over the heated substrate. There are two variables to be considered: pressure within the close coupled reaction chamber and the gas flow rate into the chamber.

The preferred pressure selected depends upon the precursor chosen. In general terms, where precursors of greater molecular complexity are used, improved two-dimensional crystalline material quality and rate of production is observed using lower pressures, e.g. less than 500 mbar. Theoretically, the lower the pressure the better, but the benefit provided by very low pressures (e.g. less than 200 mbar) will be offset by very slow two-dimensional crystalline material formation rates.

Conversely for less complex molecular precursors, higher pressures are preferred. For example where methane is used as a precursor for graphene production, a pressure of 600 mbar or greater may be suitable. Typically, it is not expected to use pressures greater than atmospheric because of its detrimental impact on substrate surface kinetics and the mechanical stresses placed on the system. A suitable pressure can be selected for any precursor through simple empirical experimentation, which may involve for example, five test runs using respective pressures of 50 mbar, 950 mbar and three others of equidistance intervals between the first two. Further runs to narrow the most suitable range can then be conducted at pressures within the interval indentified in the first runs as being most suitable.

The precursor flow rate can be used to control two-dimensional crystalline material deposition rate. The flow rate chosen will depend upon the amount of the species within the precursor and the area of the layer to be produced. Precursor gas flow rate needs to be high enough to allow coherent two-dimensional crystalline material layer formation on the substrate surface. If the flow is above an upper threshold rate, bulk material formation, e.g. graphite, will generally result or increased gas phase reactions will occur resulting in solid particulates suspended in the gas phase that are detrimental to two-dimensional crystalline material formation and/or may contaminate the two-dimensional crystalline material layer. The minimum threshold flow rate can be theoretically calculated using techniques known to the person skilled in the art, by assessing the amount of the species required to be supplied to the substrate to ensure sufficient atomic concentrations are available at the substrate surface for a layer to form. Between the minimum and upper threshold rates, for a given pressure and temperature, flow rate and two-dimensional crystalline material layer growth rate are linearly related.

The initial nucleation of the species on the target substrate, a pre-former for the eventual production of the two-dimensional crystalline material layer, can require different surface conditions from the conditions required to achieve the eventual target two-dimensional crystalline material, depending on substrate and precursor selection. It is often desirable to have very different surface kinetics on the target substrate to encourage initiation of the species' adsorption to the substrate surface. The surface kinetics, precursor decomposition and surface reaction rate may be readily controlled by the substrate temperature, reactor pressure, precursor flow rate and the presence of a dilution gas.

As such, a preferred method comprises providing a first set of reactor conditions to promote initial species adsorption to the substrate, followed by, and preferably without removing the substrate from the reaction chamber, providing a second set of reactor conditions to promote formation and coalescence of a two-dimensional crystalline material layer. In the simplest form, this embodiment is a two stage process whereby a set of conditions: e.g. a first pressure within reaction chamber, a first temperature of substrate and a first precursor flow over the substrate, is used to promote initial species adhesion to the substrate and then a second set of conditions, e.g. a second pressure, second temperature and second flow rate are used to promote formation and coalescence of the two-dimensional crystalline material layer from the initial species locations on the substrate surface. It might, for example be necessary to change only one property, e.g. only temperature, in other instances, it may be desirable to change multiple properties. Additionally, optimized two-dimensional crystalline material layers have been produced by using a preferred variant method that comprises cycling between two or more sets of reactor conditions.

In further refined processes, it may be beneficial to include a further step(s) using a further set of reactor conditions. It may also be beneficial to include a further step to treat, e.g. anneal, the two-dimensional crystalline material after formation.

In a preferred embodiment, the method includes a substrate preparation process before introducing the precursor to improve the surface condition of the substrate prior to two-dimensional crystalline material production. The precise preparation requirement is dependent on the selected substrate material and its surface condition when placed into the reaction chamber. Most commonly the substrate preparation process involves heat treatment of the substrate, to remove common surface contamination such as native oxides and/or hydro carbons, in combination with reducing the pressure within the reaction chamber to below atmospheric pressure and/or providing a reducing environment within the reaction chamber, for example a low pressure process in a hydrogen ambient. In other cases it may be preferential to change the termination of the substrate surface to provide a more suitable state for the deposition of two-dimensional crystalline material. This may be achieved by exposing the substrate, in the reaction chamber, to a gas or precursor that will change the surface state of the substrate prior to the two-dimensional crystalline material deposition process, for example using ammonia to nitrogen terminate a sapphire substrate. It is envisaged that additional preparation processes may be used to those mentioned.

In a preferred embodiment, the method comprises pulsing the flow of precursor over the heated substrate. The periods of reduced, e.g. below a minimum flow rate needed for appreciable two-dimensional crystalline material growth, or zero flow rate of precursor over the substrate aids the surface kinetics and promotes atomic surface diffusion to align the species at the substrate surface in a preferred monolayer arrangement.

The combination of one "on" period in which precursor is caused to flow over the substrate followed by an "off" and/or "reduced flow" period is defined as a cycle. The number of cycles required to improve the deposition process may vary depending upon the precursor, substrate and desired final properties of the two-dimensional crystalline material layer. Initial experimentation showed an improved result using anything between 2 to 22 cycles. Further experimentation has extended this known range to 35 cycles, though it is expected that this upper figure could be greater for certain precursors and/or reaction chamber conditions. In certain conditions is thought that as many as 100 cycles may still be beneficial.

Similarly the preferred length of the on and off times will also vary depending upon the precursor and substrate. Based on experimentation to date using a limited number of precursors for producing graphene, it is speculated that a preferred "on" time is at least ten seconds and a preferred "off" and/or "reduced flow" time is at least five seconds. These times may differ for the production of other two-dimensional layers for example the production of borophene using borane as a precursor may require significantly less than 10 seconds.

It may also be preferred to employ different process conditions for the "on" period and "off" or "reduced flow" period, for example by changing the substrate surface temperature, and/or reaction chamber pressure and/or precursor flow rate. Further it may also be preferable to use different process conditions from cycle to cycle including, for example, modifying the precursor flow rate.

In a further alternative embodiment, a purge gas may be introduced into the reaction chamber during precursor "off" periods to actively remove precursor or precursor by-products from the substrate surface which may otherwise cause a barrier to carbon surface diffusion on the substrate during precursor "off" periods. Non limiting examples of suitable purging gases include hydrogen and/or nitrogen.

In an alternative embodiment the method comprises sealing the close coupled reaction chamber after introducing the precursor to minimize and/or prevent flow of the precursor into or out of the close coupled reaction chamber. This limits the exposure of substrate surface to precursor which may aid two-dimensional crystalline material formation by reducing currents of the species from the decomposed precursor proximate the substrate surface. The amount of the species available at the surface, which will determine the quality of the two-dimensional crystalline material crystal, may be controlled by controlling the pressure within the close coupled reaction chamber and/or through use of a dilution gas within the reaction chamber. The substrate may be heated either before, after or while introducing the precursor.

The spacing between the substrate surface upon which the two-dimensional crystalline material is formed and the wall of the reactor directly above the substrate surface has a significant effect on the reactor thermal gradient. It is preferred that the thermal gradient is as steep as possible which correlates to a preferred spacing that is a small as possible. A smaller spacing changes the boundary layer conditions at the substrate surface that in turn promotes uniformity of two-dimensional crystalline material layer formation. A smaller spacing is also highly preferred as it allows refined levels of control of the process variables, for example reduced precursor consumption through lower input flux, lower reactor and hence substrate temperature which decreases stresses and non-uniformities in the substrate leading to more uniform two-dimensional crystalline material production on the substrate surface and hence, in most cases, significantly reduced process time.

Experimentation suggests that a spacing of about 100 mm, between the substrate surface upon which the two-dimensional crystalline material is formed and the precursor entry point (which may equate to the separation between the substrate surface and a wall of the reactor directly above the substrate surface), is approaching the upper limit able to provide the conditions necessary for graphene formation; this may be increased slightly to around 110 mm where the inlet for the precursor protrudes beyond the wall and into the chamber so as to be spaced from the substrate surface by around 100 mm. However, more reliable and better quality two-dimensional crystalline material is produced using a much smaller spacing equal or less than about 20 mm; a spacing equal or less than about 10 mm promotes the formation of stronger thermal currents proximate the substrate surface that increase production efficiency.

Where a precursor is used that has a relative low decomposition temperature such that there is likely to be a more than negligible degree of decomposition of the precursor at the temperature of the precursor inlet, a spacing below 10 mm is strongly preferred to minimize the time taken for the precursor to reach the substrate.

Suitable reaction chambers for this method include vertical introduction systems whereby gas is injected towards the subject from inlets directly opposite the substrate, and to a lesser extent horizontal introduction systems in which the flow is introduced into the chamber at a point laterally away from the substrate. Common examples of suitable apparatus that can be used to perform the method are vapor phase epitaxy (VPE) systems and metal-organic chemical vapor deposition (MOCVD) reactors.

Irrespective of the form of the apparatus used, it preferably comprises means to maintain the chamber wall directly opposite the substrate surface upon which two-dimensional crystalline material is to be formed, and more favorably all walls of the chamber, at a temperature substantially below the temperature of the heated substrate in order to provide a steep thermal gradient. This may be achieved, for example, by water cooling.

It is preferred that the reactor is a cold-walled reactor, in that the heater coupled to the substrate is the primary and preferably only source of heat to the chamber.

In respect of vertical introduction systems, and although less preferred, where the introduction point for precursor extends into the chamber, the difference in spacing between the end of the inlet directly opposite the substrate and the wall of the chamber directly opposite the substrate may be no more than about 10 mm.

In the case of horizontal reactor configurations, it is possible to use significantly greater spacing between the precursor introduction point and the substrate surface compared with the spacing between the chamber wall directly opposite the substrate and substrate, and still produce two-dimensional crystalline material on the substrate surface. It has been experimentally proven that a horizontal spacing between substrate surface and precursor introduction point of up to about 400 mm can produce two-dimensional crystalline material on the substrate surface.

Usually the ceiling of the reactor will be the wall that is directly opposite the substrate surface upon which two-dimensional crystalline material is produced; however, it will be appreciated that the substrate may be arranged in the reactor such that this is not the case.

It is preferred that the substrate provides a crystalline surface upon which the two-dimensional crystalline material is produced as ordered crystal lattice sites provide a regular array of nucleation sites that promote the formation of good two-dimensional crystalline material crystal overgrowth. The most preferred substrates provide a high density of nucleation sites. The regular repeatable crystal lattice of substrates used for semiconductor deposition is ideal, the atomic stepped surface offering diffusion barriers.

Notwithstanding, with modified growth conditions it is possible to use non-crystalline, poly crystalline or amorphous materials as substrates for two-dimensional crystalline material growth. Although the process may be less efficient, such substrates may be beneficial in other ways, for example cost, ease of layer removal etc.

Non-crystalline substrates may offer suitable nucleation sites through surface irregularities, surface morphology or defects. Further, substrates may be made more preferable for material deposition through surface modification such as profiling or patterning, e.g. using wet or dry etching techniques. Alternatively, or in addition, certain substrates such as, for example, plastics and ceramics may be pre-formed with a desirable surface finish that provides the nucleation sites.

Although the process may be used with a metal substrate, this is not preferred. Rather it is preferred that the substrate provides a non-metallic surface upon which the two-dimensional crystalline material is produced. This avoids the process condition limitations associated with metal substrates and circumvents the problems associated with removal of the formed two-dimensional crystalline material layer from such substrates.

Non limiting examples of suitable substrates include:
Semiconductor single crystal wafers, for example silicon (Si), silicon carbide (SiC), gallium arsenide (GaAs), Indium phosphide (InP), gallium nitride (GaN), zinc oxide (ZnO) or indium antimonide (InSb);
Insulating materials, for example sapphire ($Al_2O_3$), silica ($SiO_2$);
Compound semiconductor homo and heterostructures structures, for example InP/CdTe, GaN/InGaN/AlGaN, Si/AlN/GaN, GaAs/AlInGaP, GaN/BN, silicon on insulator (SOI);

Ceramics, for example Zirconium dioxide, aluminosilicates, silicon nitride ($Si_3N_4$), boron carbide ($B_4C$);

Glasses, for example quartz, fused silica glass, borofloat;

Plastics and polymers, for example high performance plastics such as Poly ether ketone (PEK), polyetherether ether ketone (PEEK), polyamide-imides (PAI), polyphenylene sulfides (PPS);

Composite materials, for example fibre reinforced polymers, glass reinforced matrices and carbon composites;

Nanomaterials, for example nanotubes and nanoparticles; and

Organic bases, for example organic polymers such as polyethylene terephthalate (PET) or polycarbonate (PC).

Generally it is preferred to have a substrate that is as thin as possible to ensure thermal uniformity across the substrate during two-dimensional crystalline material production. The minimum thickness of the substrate is however determined in part by the substrate's mechanical properties and the maximum temperature at which the substrate is to be heated.

The maximum area of the substrate is dictated by the size of the close coupled reaction chamber.

A wide variety of compounds can be used as a precursor, the minimum requirement being that it comprises the desired species, can be delivered into the close coupled reaction chamber in the gas phase and/or suspended by a gas, and that it will decompose at a temperature below or equal to the maximum temperature that the reactor can operate. For many commercially available reactors the maximum temperature is between 1200° C. and 1500° C. though it is conceived that future reactors will provide the ability of using higher temperatures.

For the production of graphene, the precursor may include one or more compounds from any one or more of the groups: hydrocarbon, hydride, halocarbon, including haloalkane and halo amides, metallocene, metalorganic, amine including alkylamines, organic solvents and azo compounds, and also optionally azides, imides, sulphides and phosphides. These groups provide precursors with non-carbon decomposition by products that can be removed from the reaction chamber without incorporation within the graphene or interfering with the deposition process. It is possible that the precursor includes multiple carbon-comprising compounds from one or more of the above groups.

The precursor favorably is comprised from and more favorably consists of one or more compounds from any one or more of the groups: halocarbon, hydrocarbon, azo and metallocene, and optionally metalorganic, because they are comparatively easy to handle and are widely available.

The precursor is most favorably comprised from or consists one or more of bromomethane, methane, ethane, cyclopentadienylmagnesium, carbon tetra bromide, azomethane, azoethane and/or acetylene.

Methane, ethane, and acetylene are particularly suitable because they are commercially available in high purity form and have a molecular structure that comprises the wanted carbon; the other constituent, hydrogen (and in the case of the azo compounds, nitrogen), does not interfere with the graphene deposition process.

Azomethane and azoethane further have a molecular structure that provides a free radical carbon group from which it is easy to liberate carbon.

Halcocarbons are considered to be particularly suitable precursors because they are generally volatile making them easy to deliver to the reactor in the gas phase and readily dissociate to release carbon and the halogen, which itself is volatile and so easy to evacuate from the chamber.

Bromomethane is particularly favored because its high volatility provides two advantages. Under one set of process conditions, in which a pressure within the chamber that is lower than the vapor pressure of bromine, bromine is readily removed from the reaction chamber without interaction with the graphene layer. In a second set of process conditions, in which the pressure within the reaction chamber is greater than the vapor pressure of bromine, bromine can be incorporated into the graphene as a dopant.

It is speculated that other compounds within the halocarbon group will exhibit similar properties making them suitable as both a pure graphene source and a doped graphene source. Examples of speculated compounds within this group include bromoethane, methyliodide and methylchloride. It is also believed that certain non-halocarbon compounds may be suitable as both a pure graphene source and a doped graphene source, such as for example cyclopentadienylmagnesium, carbon tetra bromide and optionally also triethylborane.

For the production of silicene the precursor may include one or more compounds from the silane, silicon comprising metalorganic or organosilicon molecular groups. These groups provide precursors that comprise the desired silicon and non-silicon containing decomposition by-products that can be readily removed from the reaction chamber without affecting the silicene growth process. Preferred precursor compounds include one or more of but are not limited to: silane, disilane, methylsilane, silicon tetrachloride and tetramethyl or tetraethyl-orthosilicate. It is possible that the precursor includes multiple silicon-comprising compounds from one or more of the above groups.

For the production of borophene the precursor may include one or more compounds from the borane, organoboron or boron comprising metalorganic molecular groups. These groups provide precursors that comprise the desired boron and non-boron containing decomposition by-products that can be readily removed from the reaction chamber without affecting the borophene growth process. Preferred precursor compounds include one or more of; borane, diborane, trimethyl and triethyl-boron. It is possible that the precursor includes multiple boron-comprising compounds from one or more of the above groups.

For the production of germanene the precursor may include one or more compounds from the germane or metalorganic molecular groups. These groups provide precursors that contain the desired germanium and non-germanium containing decomposition by-products that can be readily removed from the reaction chamber without affecting the germanene growth process. Preferred precursor compounds include one or more of, germane, $(C_2H_5)_4Ge$ and $(n-C_4H_9)_4Ge$. It is possible that the precursor includes multiple germanium-comprising compounds from one or more of the above groups.

In certain preferred embodiments, a mixture of the precursor with a dilution gas is passed over the heated substrate within a close coupled reaction chamber. The use of a dilution gas allows further refinement of the control of the carbon supply rate.

It is preferred that the dilution gas includes one or more of hydrogen, nitrogen, argon and helium. These gases are selected because they will not readily react with a large number of available precursors under typical reactor conditions, nor be included in the graphene layer. Notwithstanding, hydrogen may react with certain precursors. Additionally, nitrogen can be incorporated into the graphene layer under certain conditions. In such instances one of the other carrier gases can be used.

In spite of these potential problems, hydrogen and nitrogen are particularly preferred because they are standard gases used in MOCVD and VPE systems.

In one preferred variant embodiment, the method comprises heat treating the formed two-dimensional crystalline material (often referred to as 'annealing' within the semiconductor production field) within the close coupled chamber. Generally it is expected that the annealing temperature will be equal to or greater than the formation temperature, though may, in certain cases, be below. For example, a temperature greater than 1100° C. has been shown to cause lattice reordering providing improved graphene structure. For silicene a heat treatment temperature as low as ~150° C. has been shown to induce dehydrogenation of the layer resulting in improved electrical properties. The annealing process may comprise multiple stages, in which the two-dimensional crystalline material is held at different temperatures, for example a first stage at a lower temperature to facilitate removal of impurities, and a second stage at a higher temperature to improve lattice structure.

As alluded to above, the flexibility in the reaction conditions provided by the invention allows for the production of controllably doped two-dimensional crystalline material structures. To this end, a favorable further embodiment of the invention comprises introducing a doping element into the close coupled reaction chamber and selecting a temperature of the substrate, a pressure of the reaction chamber and a gas flow rate to produce a doped two-dimensional crystalline material. Straightforward empirical experimentation can be used to determine these variables using the afore described guidance. This process can be used with or without a dilution gas.

In one variant of this method the precursor molecule used for two-dimensional crystalline material growth includes the doping element.

In an alternative variant the precursor-comprising the species and a second precursor comprising the doping element is introduced to the substrate within a close coupled reaction chamber; the second precursor being a gas or suspended in gas. In certain embodiments, the flow of the second precursor is pulsed to allow time for the two-dimensional crystalline material layer to preferentially form on the substrate surface. In a further variation, more than one doping element may be introduced either for example by including a third precursor and/or through using a first precursor that includes a doping element with the second precursor.

There is no perceived restriction as to doping element that may be introduced. Commonly used dopant elements for the production of graphene include silicon, magnesium, zinc, arsenic, oxygen, boron, bromine and nitrogen. For silicone favorable doping elements include oxygen, copper, silver, gold, iridium and platinum. In the case of borophene favorable doping elements include carbon and nitrogen.

A wide variety of compounds can be used as a dopant precursor, the minimum requirement being that it can be delivered into the close coupled chamber in the gas phase or suspended in a gas flow, and that it will decompose to release the required dopant in the conditions used to grow two-dimensional crystalline material with the selected precursor.

Commonly available compounds that may be suitable as dopant precursor sources include those within following groups: hydride, metalorganic, metallocene and halocarbon.

The flexibility in the reaction processes allowed by the invention provides the ability to alter the reactor conditions during and/or between layer formation. This provides the possibility of depositing multiple layers and/or layers with varying properties from layer to layer. As such, according a further preferred embodiment, the method may additionally comprise the step of changing the reactor conditions e.g. the temperature of the substrate and/or the pressure of the reaction chamber or flow rate of precursor to form a further two-dimensional crystalline material layer or doped two-dimensional crystalline material layer over (e.g. on top of) the first layer of two-dimensional crystalline material or doped two-dimensional crystalline material resulting in a two-dimensional crystalline material heterostructure. Alternatively it may comprise introducing a second precursor or changing the precursor between formation of the first and second stacked two-dimensional crystalline material layers such that the second layer has a different material property to the first layer.

Combining two-dimensional material layers opens the possibility of producing heterostructures with extraordinary structure properties, provided continuous discrete two-dimensional layers can be produced cumulatively without cross layer contamination or interlayer molecular or elemental diffusion. With considered control of the growth parameters, evaluating the deposition properties of the current two-dimensional layer growth in conjunction with the conditions required to keep the preceding two-dimensional layer stable two-dimensional material heterostructures may be produced.

The invention also provides the possibility of producing heterostructures, and thus as a corollary, electronic devices comprising at least one two-dimensional crystalline material layer (doped or otherwise) with at least one non-two-dimensional crystalline material layer, e.g. a layer of semiconductor material and/or a dielectric material, in situ within the close coupled reaction chamber, i.e. without the need to remove the first formed layer from the chamber before adding the next layer. This overcomes the problems of ambient environment contamination suffered by prior art methods that require the structure to be transferred between different deposition chambers to provide the different process conditions required for formation of each layer of the heterostructure.

Combination of the above techniques may be used to form heterostructures of any desired configuration, for example, simple two or three stacked junction devices through to complex superlattice structures.

It is believed that the above described method allows the manufacture of graphene material with a novel structure and therefore according to a second aspect of the invention there is provided a two-dimensional crystalline material (preferably graphene) sheet having a mean grain size equal or greater than 20 micrometers.

Because of the significantly greater mean grain size compared with existing graphene materials, the mechanical strength of the graphene sheet is sufficiently increased such that it is self supporting, and thus can be removed from a substrate upon which it was formed with no or little disintegration.

According to a further aspect of the invention there is provided a method of manufacturing a heterostructure that includes a two-dimensional crystalline material having an interface with a second layer, the method comprising: using a first set of reactor conditions to produce a two-dimensional crystalline material on a substrate within a close coupled reaction chamber; and introducing a second precursor under a second set of reactor conditions to form the second layer on the substrate.

The two-dimensional crystalline material may be formed and the second layer deposited thereon or vice-versa. This allows which ever layer is formed first to remain within the chamber, and thus remain free of contaminate before the next layer is deposited.

The second layer may be formed directly on top of the first layer or the first layer may be formed directly on top of the second layer.

The second layer may be another two-dimensional crystalline material layer or a non-two-dimensional crystalline material layer. The second layer may for example be a semiconductor.

In one example, the second layer comprises at least one of the following: GaN, BN, AlN AlGaN, SiN.

In order to promote the best formation of the individual layer, it is preferred that the separation between the substrate and the precursor inlet (which may equate to the separation between the substrate and a ceiling of the reactor chamber directly above the substrate) is changed between forming the two-dimensional crystalline material layer and the non-two-dimensional crystalline layer.

According to a further aspect of the invention there is provided a heterostructure material that includes a two-dimensional crystalline material having an interface with a second layer, wherein the interface is continuous across the material. Preferably the heterostructure has a width greater than 1 cm squared.

BRIEF DESCRIPTION OF THE DRAWINGS

The accompanying figures in which like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

As required, detailed embodiments are disclosed herein; however, it is to be understood that the disclosed embodiments are merely examples and that the devices and methods described herein can be embodied in various forms. Therefore, specific structural and functional details disclosed herein are not to be interpreted as limiting, but merely as a basis for the claims and as a representative basis for teaching one of ordinary skill in the art to variously employ the disclosed subject matter in virtually any appropriately detailed structure and function. Further, the terms and phrases used herein are not intended to be limiting, but rather, to provide an understandable description. Additionally, unless otherwise specifically expressed or clearly understood from the context of use, a term as used herein describes the singular and/or the plural of that term.

The terms "a" or "an", as used herein, are defined as one or more than one. The term "plurality", as used herein, is defined as two or more than two. The term "another", as used herein, is defined as at least a second or more. The terms "including" and "having," as used herein, are defined as comprising i.e., open language. The term "coupled," as used herein, is defined as "connected," although not necessarily directly, and not necessarily mechanically.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Figure 1:
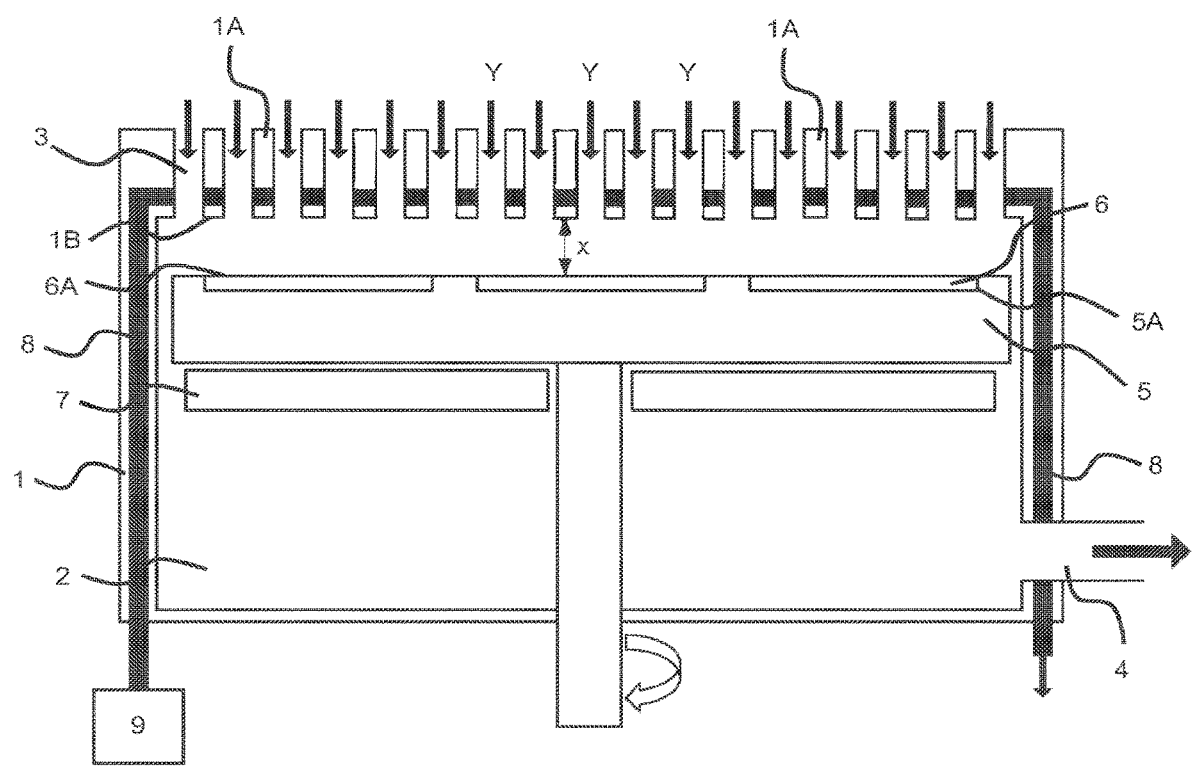
FIG. 1 is a schematic of a vertical reactor used to produce a two dimensional material.

The reactor of FIG. 1 is constructed for the deposition of one or more two dimensional material layers on a substrate through the method of Vapor Phase Epitaxy (VPE), in which a precursor is introduced to thermally, chemically and physically interact in the vicinity of and on the substrate to form a single or multi-layer two-dimensional material film.

The apparatus comprises a close coupled reactor 1 having a chamber 2 having an inlet or inlets 3 provided through a wall 1A and at least one exhaust 4. A susceptor 5 is arranged to reside within the chamber 2. The susceptor 5 comprises one or more recesses 5A for retaining one or more substrates 6. The apparatus further comprises means to rotate the susceptor 5 within the chamber 2; and a heater 7, e.g. comprising a resistive heating element, or RF induction coil, coupled to the susceptor 5 to heat the substrate 6. The heater 7 may comprise a single or multiple elements as required to achieve good thermal uniformity of the substrate 6. One or more sensors (not shown) within the chamber 2 are used, in conjunction with a controller (not shown) to control the temperature of the substrate 6.

The temperature of the reactor's 1 walls are maintained at substantially constant temperature by water cooling.

The reactor walls define one or more internal channels and/or a plenum 8 that extend substantially adjacent (typically a couple of millimeters away) the inner surface of reactor walls including inner surface 1B of wall 1A.

During operation, water is pumped by a pump 9 through the channels/plenum 8 to maintain the inside surface 1B of wall 1A at or below 200° C. In part because of the relatively narrow diameter of the inlets 3, the temperature of the precursor (which is typically stored at a temperature much below the temperature of inside surface 1B), as it passes through inlets 3 through wall 1A into the chamber 1 will be substantially the same or lower than the temperature of the inside surface 1B of wall 1A.

The inlets 3 are arranged in an array over an area that is substantially equal or greater than the area of the one or more substrates 6 to provide substantially uniform volumetric flow over substantially the entirety of surfaces 6A of the one or more substrates 6 that face the inlets 3.

The pressure within the chamber 2 is controlled through control of precursor gas flows through inlet(s) 3 and exhaust gas through exhaust 4. Via this methodology, the velocity of the gas in the chamber 2 and across the substrate surface 6A and further the mean free path of molecules from the inlet 3 to substrate surface 6A are controlled. Where a dilution gas is used, control of this may also be used to control pressure through inlet(s) 3.

The susceptor 5 is comprised from a material resistant to the temperatures required for deposition, the precursors and dilution gases. The susceptor 5 is usually constructed of uniformly thermally conducting materials ensuring substrates 6 are heated uniformly. Examples of suitable susceptor material include graphite, silicon carbide or a combination of the two.

The substrate(s) 6 are supported by the susceptor 5 within the chamber 2 such that they face wall 1A with a separation, denoted in FIG. 1 by X, of between 1 mm-100 mm, though generally the smaller the better. Where the inlets 3 protrude into or otherwise sit within the chamber 2, the relevant separation is measured between the substrate(s) 6 and exit of the inlets 3.

The spacing between the substrate 6 and the inlets 3 may be varied by moving the susceptor 5, substrate 6 & heater 7.

An example of a suitable close coupled reactor is the AIXTRON® CRIUS MOCVD reactor, or AIXTRON® R&D CCS system.

Precursors in gaseous form or in molecular form suspended in a gas stream are introduced (represented by arrows Y) into the chamber 2 through inlets 3 such that they will impinge on or flow over the substrate surface 6A. Precursors that may react with one another are kept separated until entering the chamber 2 by introduction through different inlets 3. The precursor or gas flux/flow rate is controlled externally to the chamber 2 via a flow controller (not shown), such as a gas mass flow controller.

A dilution gas may be introduced through an inlet or inlets 3 to modify gas dynamics, molecular concentration and flow velocity in the chamber 2. The dilution gas is usually selected with respect to the process or substrate 6 material such that it will not have an impact on the growth process of the two-dimensional material. Common dilution gases include Nitrogen, Hydrogen, Argon and to a lesser extent Helium.

The following describes example processes using the aforementioned apparatus that successfully produced two-dimensional material layers and two-dimensional layer heterostructures from one or more two-dimensional layers and one or more other semiconductor or dielectric materials. In all examples a close coupled vertical reactor of diameter 250 mm with six 2" (50 mm) target substrates were used. For reactors of alternate dimensions and/or different target substrate areas, the precursor and gas flow rates can be scaled through theoretical calculation and/or empirical experimentation to achieve the same results.

Example 1

Graphene monolayer(s) can be produced on a selected substrate within the standard operating parameters of a close coupled reaction chamber via VPE. With careful selection of the graphene precursor and substrate type and matching with suitable reaction chamber parameters it is possible to deposit graphene on the substrate surface.

For example, selecting a metallocene, $Cp_2Mg$ or $Cp_2Fe$ as a process precursor the reactor is heated to a temperature such that the surface of the substrate (here silicon or sapphire) is greater than the required, or complete, decomposition temperature of the precursor, here >500° C. The reactor pressure is lowered to suitable vacuum level to ensure evacuation of unwanted process by-products, for the metallocenes in this example a pressure of <200 mbar has proven successful. The metallocene and a dilution flow of hydrogen are then introduced to the reactor, through the inlets, and hence substrate surface at a suitable flow rate, in this example 700 sccm of metallocene and 1300 sccm of hydrogen is ideal. The precursor flows into the reactor for a period of time that allows the formation of a full, uniform graphene monolayer on the substrate surface, in this example 545 seconds is ideal for a silicon substrate and 380 seconds for a sapphire substrate. After completion of the layer the metallocene flow is ceased and the reactor is cooled under a continuing hydrogen flow of 2000 sccm at continuing low pressure, to preserve the graphene surface until suitably cooled, ideally to <100° C.

Figure 2:
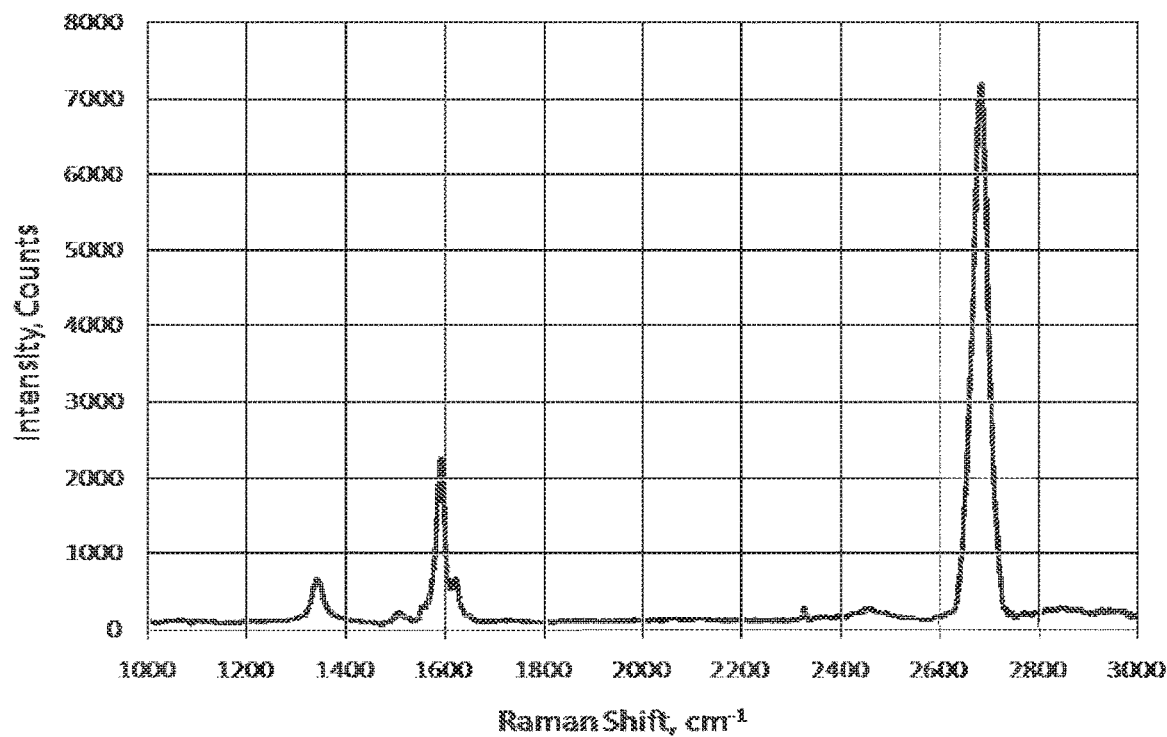
FIG. 2 is a Raman spectrum of graphene produced using vapor phase epitaxy within the reactor of FIG. 1 according to the method of example 1.

A Raman spectrum of the resulting graphene formed by this process is illustrated in FIG. 2.

Example 2

Graphene monolayer(s) production using $CH_3Br$ as a process precursor. The reactor is heated to a temperature such that the substrate, here sapphire, is greater than the complete decomposition temperature of the precursor, here >350° C. The reactor pressure is lowered to a suitable vacuum level to ensure evacuation of unwanted decomposition and reaction by-products and also facilitate high enough residency time of carbon products at the substrate surface to form graphene. For $CH_3Br$ a pressure of 600 mbar has been proven ideal, as the main unwanted by-product Br has vapor pressure higher than this at the selected deposition temperature. The precursor and a dilution flow of nitrogen gas are then introduced to the reactor and hence substrate, through the chamber inlets, at a suitable flow rate, in this example 1000 sccm is ideal for $CH_3Br$ and 2000 sccm for nitrogen. Nitrogen is used in this process so as to limit the possible formation of HBr. The precursor and dilution gas flow through the reactor for a period of time that allows the formation of a full, uniform graphene monolayer on the substrate surface, in this example 320 seconds is ideal. After completion of the layer the precursor flow is ceased and the reaction chamber cooled under continuing Nitrogen flow until the substrate, and graphene layer, are at a suitably low temperature, ideally <100° C.

Example 3

Graphene monolayer(s) production using $CH_4$ as a process precursor. The reactor is heated to a temperature such that the substrate, here sapphire, is greater than the initial decomposition temperature of the precursor, here >1100° C. The reactor pressure is set to a suitable vacuum level to ensure favorable gas velocity near the substrate surface, for $CH_4$ a pressure of 800-900 mbar is suitable as the by-products of $CH_4$ decomposition will not adversely affect the growing material, the advantage here is the increased residency time of precursor material, at higher reactor pressure, promotes high deposition rates, significantly shortening the time required to deposit graphene. The precursor and a dilution gas of hydrogen are then introduced to the reactor and hence substrate surface, through the chamber inlets, at a suitable flow rate, in this example 1000 sccm is ideal for the $CH_4$ and 2000 sccm for the hydrogen. The precursor flows across the substrate surface for a period of time that allows the formation of a full, uniform graphene monolayer on the substrate surface, in this example 30 seconds is ideal. After completion of the layer the precursor flow is ceased and the hydrogen dilution flow increased to 3000 sccm, the reactor chamber is then cooled under continuing hydrogen flow until the substrate and graphene layer are suitably cool, ideally <100° C.

Example 4

Graphene production on different substrates can be improved through the application of substrate preparation or conditioning techniques prior to graphene growth, ensuring the substrate surface is in the most preferential state before introducing precursors to initiate graphene deposition.

For example when growing graphene on a silicon substrate the quality of a graphene monolayer is significantly improved by conditioning the silicon surface before introducing the precursor. In general, and in this case, heating the silicon substrate to a surface temperature of 1050° C. at a reactor pressure of 100 mbar under a hydrogen gas flow of 5000 sccm unwanted surface contamination on the substrate surface, including native oxide, is removed revealing a pure silicon surface.

Subsequent deposition of graphene can be readily achieved on this prepared surface with process conditions of; reactor temperature 900° C., reactor pressure 200 mbar, $Cp_2Mg$ precursor flow rate of 700 sccm and hydrogen dilution flow rate of 1300 sccm resulting in a graphene crystal structure significantly improved on the graphene achieved without applying the substrate conditioning procedure. Again here, reactor cooling with a hydrogen flow is desirable until the substrate and graphene have reached suitably low temperature, ideally <100° C.

In the following examples the substrate used was either silicon or sapphire. In the case of silicon substrates the conditioning process outlined in Example 4 is applied prior to the graphene deposition process.

Example 5

Modifying the dilution gas flow for the process of graphene deposition can be preferential for certain precursors or substrates, allowing additional control to graphene layer formation while maintaining the same rate of carbon delivery to the substrate surface. Further, this can be critical for ensuring good material formation in some cases.

For example using a precursor of carbon tetrabromide ($CBr_4$), with a silicon or sapphire substrate at a temperature of 1025° C. and a reactor pressure of 400 mbar a precursor flow rate of 1000 sccm will result in graphene monolayer deposition exhibiting undesirable microstructure with small grain size and high defect levels due, largely, to interstitial point defect formation. Introducing a dilution of hydrogen ($H_2$) to the precursor flow for example 2000 sccm, ie a ratio of 2:1 $H_2$:$CBr_4$, with other process parameters remaining the same, improves graphene layer material markedly. The presence of hydrogen during the deposition process results in the formation of HBr a very high vapor pressure byproduct of precursor decomposition and dilution gas reaction that is readily evacuated reducing parasitic interactions at the substrate surface. Increasing the flow ratio up to about 12:1 further improves the graphene layer, for this precursor ($CBr_4$). Above a ratio of 12:1 the concentration of dilution species, hydrogen, in the reactor adversely affects the ability of carbon to reach the substrate surface inhibiting coherent layer deposition resulting in a situation where graphene cannot be produced.

Example 6

Graphene with varying, or predefined properties is produced by allowing doping of the graphene layer from other atomic species comprised within the precursor to be incorporated in the graphene layer.

For example using a precursor of $Cp_2Mg$ at a substrate temperature of 870° C. with precursor flow rate of 800 sccm at reactor pressure of 300 mbar the precursor is introduced, through the inlets once the substrate has reached the desired temperature and flows for a period of 500 seconds. This allows the stable incorporation of Mg within the graphene lattice producing a doped graphene layer. Modification of the pressure and/or temperature gives control over the doping level, although care has to be exercised to ensure graphene quality is not compromised by applying reactor deposition conditions that are preferential to doping but outside the ranges for good graphene formation. Applying this technique, but allowing for precursor and substrate properties, may achieve graphene performance, electrical and mechanical, as desired.

Example 7

Graphene is produced with varying properties by introducing a second precursor to actively dope the graphene layer.

For example using a precursor of $CH_4$ with a substrate temperature of 1250° C. at reactor pressure of 720 mbar and precursor flow rate of 1000 sccm to produce graphene a second, preferred dopant, precursor can be introduced to supplement the material construction. For example using TEZn, to zinc dope the graphene layer, at a flow of 25 sccm will produce a uniform, large grain size graphene with preferentially resistive properties.

Example 8

Graphene is produced more efficiently through the control (in this example reduction) of the reactor precursor introduction point to substrate surface spacing.

For example using a precursor of $CH_3Br$ at a flow rate of 800 sccm; a substrate temperature of 1000° C.; a chamber pressure of 650 mbar and a precursor introduction point to substrate separation of 12 mm, graphene can be readily deposited in growth time of 360 seconds.

Reducing the precursor introduction point to substrate separation to a distance of 10 mm allows the same conditions to be applied with a reduced growth time of 315 seconds to achieve the same graphene as would be produced in 360 seconds with a separation of 12 mm.

Alternatively this reduced separation allows the substrate temperature to be reduced to 970° C. whilst maintaining a $CH_3Br$ at a flow rate of 800 sccm a chamber pressure of 650 mbar and deposition time of 360 s to achieve the same graphene. The reduced temperature in this case leads to less substrate deformation, due to reduced thermal expansion, resulting in a more uniform graphene layer over the substrate surface. Similarly, reducing the precursor introduction to substrate surface separation to 5 mm allows further reduction in the surface temperature, in this example to 920° C., whilst maintaining the other process variables at the same values.

It should be noted that this methodology can also be applied to the variation of other parameters, for example using a precursor of $CH_3Br$ at a flow rate of 800 sccm; a substrate temperature of 1000° C.; a chamber pressure of 650 mbar and a ceiling to substrate separation of 12 mm, graphene can be readily deposited in growth time of 360 seconds. Reducing the ceiling to substrate surface separation to 5 mm allows the precursor flow rate to be reduced to 550 sccm whilst maintaining a substrate temperature of 1000° C. under a chamber pressure of 650 mbar and deposition time of 360 s to achieve the same graphene layer result.

Example 9

Graphene layer material properties can be modified through simple flow "pulsing".

For example using a precursor of $Cp_2Mg$, a substrate temperature of 1000° C. and reactor chamber pressure of 200 mbar the $Cp_2Mg$ is introduced to the reactor at a flow rate of 1000 sccm for a period of 20 seconds, the flow is then paused for a period of 20 seconds after which the flow is re-initiated for a further 20 seconds, then again paused for the following 20 seconds. Repeating the methodology several times, in this example for 10 cycles, has shown to significantly increase the amount of Mg that can be incorporated into the graphene layer altering the final layer electrical properties.

Example 10

Graphene layer structure can be modified through precursor flow rate 'pulsing'. A modification to the pulsed flow approach of Example 9 is employed, in this case applying a high flow, low flow procedure whereby the precursor is admitted to the substrate surface for a period at a level above the minimum flow threshold for growth and then reduced to a level below the minimum flow threshold where there the growth rate is close to or substantially zero for a period and repeated for a number of cycles. In this method the low flow step, as opposed to the precursor off period, as in standard pulsing, helps reduce carbon desorption from the surface during this time.

For example using a growth precursor of $CH_3Br$ at a substrate temperature of 850° C. and chamber pressure of 550 mbar the precursor is introduced to the reaction chamber at a flow of 1000 sccm for a period of 15 seconds, the flow is then lowered to a flow of 200 sccm for a period of 20 seconds, the flow is then increased back to the initial 1000 sccm for a further 15 seconds. This stepped flow procedure is repeated a desired number of cycles, typically 5 to 10 periods to achieve good layer ordering. This process has been shown to significantly improve graphene grain size, allowing, by controlling the number of cycles, effective control of graphene material structure.

Example 11

Graphene layer structure properties can be modified through precursor/dilution gas switching or 'pulsing'. Applying a further modification to the pulsed deposition process of example 9 comprising switching between precursor and non-carbon purge gas comprising non invasive or non reactive inlet gas to remove the precursor rapidly from the substrate surface or vicinity during the period that the precursor is not flowing. In this case precursor is flowed for a period of time then stopped and the purge gas started for a period of time before flow of purge gas is stopped and the flow of precursor re-started, the procedure is repeated for a number of cycles.

For example, using a precursor of methane at a substrate temperature of 1220° C. and chamber pressure of 800 mbar the precursor is introduced to the reaction chamber at a flow of 1000 sccm for a period of 10 seconds, the precursor flow is then stopped and the purge gas flow of 1000 sccm H2 started for a period of 10 seconds, the precursor flow is then reintroduced for a period of 10 seconds and so on for a selected number of cycles. Eight cycles has been shown to reduce defect density of the graphene layer.

Example 12

In an improvement to example 11, a further modification of the pulsed deposition procedure is to flow the dilution gas continuously and only switch the precursor gas on and off ensuring there is a continuous flow over the substrate surface at all times.

For example using a precursor of methane as a carbon source at a substrate temperature of 1220° C. and chamber pressure of 800 mbar the precursor is introduced to the reaction chamber at a flow of 1000 sccm at the same time as a dilution gas flow of H2 at 1000 sccm for a period of 10 seconds, the precursor flow is then stopped and the dilution gas allowed to continue to flow for a period of 10 seconds. This constitutes a cycle. The precursor flow is then reintroduced for a further period of 10 seconds and so on for a selected number of cycles. Using twenty four cycles has been shown to significantly reduce the defect density of the graphene layer.

Example 13

Efficiency of graphene production can be improved through the application of a 'sealed volume' process. In this process enough precursor is admitted to the reactor to enable graphene formation on the substrate surface whilst limiting significantly the amount of precursor consumed. The process involves filling the reaction chamber with precursor such that the environment does not cause the decomposition of the precursor, then initiating a reaction by increasing the substrate surface temperature.

For example using a precursor of $CH_3Br$, the reaction chamber is reduced to a low pressure, typically 1-5 mbar, and the exhaust sealed. Precursor is admitted to the reactor, through the inlets, allowing the volume to refill to a pressure of 900 mbar, creating a precursor rich static environment. The reactor is heated rapidly, 5° C./s is sufficient, so that the substrate reaches a temperature of 900° C. and held at temperature for a period of time, in this example 10 minutes. Precursor circulation is induced via thermal convection and decomposition of the precursor occurs in the vicinity of the substrate allowing graphene to be produced on the substrate surface. After 10 minutes the reactor is cooled as rapidly as possible, by switching the heating element off, to room temperature. Once the temperature of the reactor chamber and substrate have fallen below the decomposition temperature of the precursor, the reactor is evacuated and then purged, using a purge gas, in this example nitrogen.

This process provides an extremely controllable method for the amount of carbon deposited on the target substrate by limiting the maximum amount of precursor available to the substrate surface for the whole deposition period. Molar concentration of precursor can be readily modified through alteration of the initial re-fill pressure. It should be noted that this process can be difficult to perfect and control in standard reaction chambers as ambient chamber cooling affects the process significantly.

Example 14

A minor variation of the sealed volume process of example 13 in which the chamber is evacuated and then purged with a purge gas such as hydrogen at a flow rate of 5000 sccm for a period of 5 minutes following which the reactor is cooled as rapidly as possible to room temperature. This has been shown to aid limitation of graphene surface contamination during the cooling step.

Example 15

A further variation to the sealed volume process of example 13 in which the substrate is first heated to a temperature in excess of the precursor decomposition temperature before the chamber is evacuated and the precursor then introduced. This procedure has been shown to reduce defect density of the graphene monolayer.

Example 16

Graphene is refined through the application of a post deposition processing technique to modify the graphene structure, reducing structural defects and precipitate the ejection of lattice contamination consisting of unwanted atomic and molecular species that would otherwise deform graphene monolayers and adversely affect graphene material properties.

Depositing graphene using a precursor of $Cp_2Fe$ at a flow rate of 750 sccm with substrate temperature 960° C. and reactor pressure 175 mbar has been shown to produce significantly doped graphene within 560 seconds. While this form of graphene is suitable for some applications it can be modified to have different properties by post deposition heat and gas treatment. After completion of the deposition process increasing the substrate temperature to 1200° C. for 30 minutes under a hydrogen gas introduced at a flow rate of 10000 sccm, results in a significant change to the graphene layer.

Example 17

Optimized graphene layers can be produced through the combination of two or more of the aforementioned examples and the addition of further beneficial process steps.

For example, a sapphire substrate is first prepared by heating within the reaction chamber to a substrate surface temperature of 1100° C. under a hydrogen gas flow of 10000 sccm at a pressure of 50 mbar for at least 5 minutes to remove condensed and contaminating materials or species from the substrate surface. The substrate is then cooled to a temperature of 975° C. whereupon $NH_3$ is introduced at a flow rate of 3000 sccm into the reactor chamber for a period of 60 seconds to nitride, or nitrogen terminate the substrate surface. The flow of $NH_3$ is stopped and the precursor, in this case $CH_4$, is introduced at a flow rate of 200 sccm accompanied by a dilution gas flow of $H_2$ at 7000 sccm for a second period of 60 seconds. The substrate is heated to a temperature of 1220° C., the reactor pressure increased to 700 mbar and the precursor flow increased to a flow rate of 800 sccm accompanied by a dilution gas flow increase to 10000 sccm of $H_2$. After reaching the target substrate temperature of 1220° C. the introduction of precursor, $CH_4$, is pulsed through a cycle of 10 seconds on and 5 seconds off for 15 cycles. In each subsequent cycle the precursor flow rate is reduced by 5 sccm. Upon completion of the 15 cycles the reactor temperature is increased to 1250° C. and held for 60 seconds after which the reactor pressure is reduced to 30 mbar and held for 60 seconds. The reactor pressure is then taken back to 700 mbar for a further 60 seconds, cycling between these two pressures, and holding for 60 seconds, is completed 10 times. The reactor is then cooled, as rapidly as possible, under a continued $H_2$ flow.

The same process structure, modified in terms of pressure, temperature and flow rate, can be applied to any suitable precursor and viable substrate to produce graphene of high quality.

Example 18

Multilayer graphene is produced through the variation of process variables to enable further graphene layers to be deposited on the first monolayer. As graphene is generally self-limiting in lattice construction, when produced in high quality form via VPE, the surface energy state needs to be overcome to form subsequent high quality mono-layers of graphene on the previous layer. This is achieved, by altering the reaction chamber conditions during formation of the further graphene layers.

For example, using a suitable hydrocarbon as the process precursor, here $CH_4$, at a substrate temperature of 1120° C.; a reactor pressure of 800 mbar and a flow rate 1000 sccm, graphene can be formed readily on a sapphire substrate surface. Continuing with these conditions will not produce high quality multilayer graphene but rather another carbon poly-type such as amorphous carbon. By decreasing the reactor pressure to 600 mbar, and/or increasing the reactor temperature to 1310° C. and lowering the precursor flow to 400 sccm it is possible to facilitate the formation of further graphene layers on the initial graphene monolayer. It is believed this technique overcomes the potential energy barrier of the previous layer surface and further inhibits the formation of bulk carbon such as graphite as opposed to graphene.

Example 19

Silicene monolayer(s) can be produced on a selected substrate within the standard operating parameters of a close coupled reaction chamber via VPE. Carefully selecting the silicene precursor and substrate type and matching with suitable reaction chamber parameters it is possible to deposit silicene on the substrate surface.

For example, selecting silane with concentration of 100 ppm in hydrogen, as the process precursor the reactor is heated to a temperature such that the surface of the substrate (here silicon or sapphire) is greater than the required, or complete, decomposition temperature of the precursor and preferential to promote surface kinetics for the formation of a silicene crystal structure, here ~920° C. The reactor pressure is lowered to suitable vacuum level to ensure evacuation of unwanted process by-products, for silane in this example a pressure of <500 mbar has proven successful. The silane and a dilution flow of hydrogen are then introduced to the reactor, through the inlets, and hence substrate surface at a suitable flow rate, in this example 2000 sccm of silane and 10000 sccm of hydrogen is ideal. The precursor flows into the reactor for a period of time that allows the formation of a full, uniform silicene monolayer on the substrate surface, in this example 800 seconds is ideal for a silicon substrate and 600 seconds for a sapphire substrate. After completion of the layer the silane flow is ceased and the reactor is cooled under a nitrogen flow of 5000 sccm at continuing low pressure, to preserve the silicene surface until suitably cooled, ideally to <100° C.

The silicene monolayer will remain intact on the substrate surface for the period that it remains within an inert environment, which may be the reactor chamber or an ancillary container, if the material can be transferred from the chamber to the container in an inert environment and the container ambient is inert.

Example 20

To enable use of silicene ex-situ of the reaction chamber the silicene layer can be capped with a material stable in an air ambient. By using a silicon based alloy it is possible to grow a capping layer on top of silicene protecting the silicene layer from exposure to the external ambient.

Using the method described in Example 19 silicene can be produced on a sapphire or silicon substrate. Upon completion of the silicene layer a further silicon nitride (SiN) layer can be produced by changing the reactor parameters and introducing a nitrogen precursor source, here $NH_3$. After completing the silicene layer the silane precursor is stopped and the reactor temperature changed to a temperature that allows the formation of high quality SiN, here 1050° C., while the reactor pressure is decreased to limit gas phase reactions during the deposition of the SiN layer, in this example 200 mbar. Once reactor conditions have been stabilised the silane is re-introduced to the reaction chamber at the same time as $NH_3$. The $NH_3$ flow rate is set to achieve a silane to $NH_3$ ratio that will enable efficient formation of SiN on the silicene surface, here 3000 sccm. The precursors are allowed to flow for a period of time that results in a continuous SiN layer, on top of the silicene, thick enough to protect and preserve the silicene once it is removed from the reaction chamber, in this case 600 seconds. The precursors are then stopped and the reactor cooled under the continuing hydrogen flow to preserve the SiN surface ideally to a temperature <100° C.

Example 21

It is possible to modify the inherent electrical, thermal and mechanical properties of silicene through the introduction of a dopant element or elements to the 2D silicene crystal structure. This can be readily achieved by introducing a doping chemical source to the deposition process while producing silicene.

For example silicene can be doped using oxygen, as in example 19, selecting silane with concentration of 100 ppm in hydrogen, as the process precursor the reactor is heated to a temperature such that the surface of the substrate (here silicon or sapphire) is greater than the required, or complete, decomposition temperature of the precursor and preferential to promote surface kinetics for the formation of a silicene crystal structure, here ~920° C. The reactor pressure is lowered to suitable vacuum level to ensure evacuation of unwanted process by-products. Unlike pure silicene production the addition of a doping source to the process has to be considered carefully here water vapor, in the form of $H_2O$, is used as the oxygen source where a pressure of <250 mbar has proven successful. The silane, doping source and a dilution flow of hydrogen are then introduced to the reactor, through the inlets, and hence substrate surface at a suitable flow rate, in this example 2000 sccm of silane, 150 sccm of $H_2O$ and 10000 sccm of hydrogen is ideal. The precursor, doping source and dilution gas flows into the reactor for a period of time that allows the formation of a full, uniform, doped, silicene monolayer on the substrate surface, in this example 920 seconds is ideal for a silicon substrate and 690 seconds for a sapphire substrate. After completion of the layer the silane and doping flows are ceased and the reactor is cooled under a nitrogen flow of 5000 sccm at continuing low pressure, to preserve the silicene surface until suitably cooled, ideally to <100° C.

Example 22

It is possible to combine graphene and silicene 2D layers to form a 2D multilayer structure in a single production process by, for example, depositing a graphene layer on a substrate surface, here sapphire, using one of the previous detailed example processes, here example 2 using $CH_3Br$. After completing the graphene layer, the reactor is purged by reducing the pressure to 100 mbar and increasing the nitrogen flow rate to 10000 sccm for a period of 600 seconds, during this period the reactor temperature is lowered to achieve a substrate temperature suitable for the decomposition of the silicene precursor and produce conditions at the surface of the previous graphene layer preferential for the formation of silicene, here 1015° C. After completing the purge, the reaction chamber pressure is changed to achieve a condition preferential for the formation of silicene on the graphene surface and limiting the possibility of gas phase and surface reactions that could disrupt uniform silicene deposition, in this example 575 mbar. The nitrogen flow is then replaced with a hydrogen purge flow of 5000 sccm for a period of 600 seconds. Silane, of concentration 100 ppm in hydrogen, and a dilution gas of hydrogen are introduced to the reaction chamber with flows of 2500 sccm and 12000 sccm respectively. The silane and dilution gas are flowed for a period of time that allows the formation of a layer of silicene on the graphene surface, in this example 540 seconds, during this period the reactor pressure reduces, to a final pressure of 100 mbar. After this period the silane flow is ceased and the reaction chamber cooled under a continuing flow of hydrogen, at low pressure.

Figure 3:
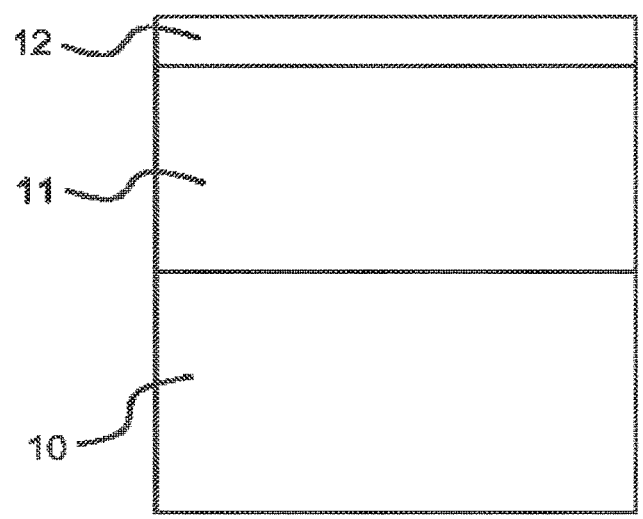
FIGS. 3-6 are schematic cross sections of heterostructures, formed on a substrate, comprising one or more two dimensional material layers in combination with one or more semiconductor or dielectric material layers.

With the capability to deposit 2D materials, both in monolayer and multilayer form, using the apparatus of FIG. 1, 2D material layers can be combined with semiconductor and/or dielectric materials to produce a simple heterostructure. FIG. 3 illustrates an example heterostructure formed on a substrate 10 comprising a semiconductor or dielectric layer 11 upon which a 2D material layer 12 is formed.

Example 23

A simple heterostructure of Boron Nitride (BN) and graphene can be produced in a single continuous deposition process. For example, selecting precursors such as triethylboron (TEB) and ammonia gas ($NH_3$), the reactor is heated to a temperature such that the surface of the substrate (here silicon or sapphire) is greater than the required, or complete, decomposition temperature of the precursor, here >700 C. The reactor pressure is lowered to a suitable vacuum level to ensure evacuation of unwanted process or gas phase reaction by-products. For these precursors, a pressure of <100 mbar has proven successful. The TEB, $NH_3$ and dilution flows of hydrogen are then introduced to the reactor through the inlets, and hence substrate surface at a suitable flow rate. In this example, 1500 sccm of $NH_3$, 40 sccm of TEB and 2500 sccm of hydrogen are ideal. The precursors flow into the reactor for a period of time that allows the formation of boron nitride to a desired thickness. In this example, 4 hours is suitable for the deposition of 50 nm of boron nitride.

After completion of the boron nitride layer, the TEB flow and $NH_3$ flows are stopped, while maintaining the hydrogen flow. A suitable hydrocarbon precursor such as methane ($CH_4$) is selected for 2D material growth, in this case graphene. The reaction chamber temperature is changed such that the surface of the boron nitride material is greater than the required, or complete, decomposition temperature of the 2D material precursor, here >1100 C. The reactor pressure is also changed to a suitable level to ensure evacuation of unwanted process by-products from the 2D growth procedure. For this hydrocarbon precursor, a pressure of <200 mbar has proven successful. The precursor flow is now set, along with the hydrogen dilution flow, to be 1000 sccm and 2000 sccm, respectively. The precursor and dilution gas flow into the reactor for a period of time that allows for the formation of a full, uniform monolayer of graphene on the boron nitride surface; in this example 450 seconds is ideal.

After completion of the graphene layer, the methane precursor flow is ceased, and the reactor is cooled under a continuing hydrogen flow of 2000 sccm at continuing low pressure, to preserve the graphene surface until suitable cooled, ideally to <100 C.

Example 24

In a similar process to Example 23, 2D material monolayer(s) can be produced on Aluminium Nitride (AlN) on a selected substrate in the same process.

For example, selecting precursors such as trimethylaluminium (TMAl) and ammonia gas ($NH_3$), the reactor is heated to a temperature such that the surface of the substrate (here silicon or sapphire or silicon carbide) is greater than the required, or complete, decomposition temperature of the precursors, here >700 C. The reactor pressure is lowered to a suitable vacuum level to ensure evacuation of unwanted process byproducts. For these precursors, a pressure of <100 mbar has proven successful. The TMAl, $NH_3$ and dilution flows of hydrogen are then introduced to the reactor through the inlets, and hence substrate surface at a suitable flow rate. In this example, 50 sccm of $NH_3$, 50 sccm of TMAl and 10000 sccm of hydrogen are ideal. The precursors flow into the reactor for a period of time that allow the formation of aluminium nitride to a desired thickness. In this example, 1 hour is suitable for the deposition of 300 nm of aluminium nitride.

After completion of the aluminium nitride layer, the TMAl flow and $NH_3$ flows are stopped while the hydrogen flow is maintained. A hydrocarbon precursor, such as methane ($CH_4$), is selected for 2D material growth, in this case graphene. The reaction chamber temperature is changed such that the surface of the aluminium nitride material is greater than the required, or complete, decomposition temperature of the precursor, here >1100 C, while the reactor pressure is changed to a suitable level to ensure evacuation of unwanted process by-products. For this hydrocarbon precursor, in this heterostructure process, a pressure of <200 mbar has proven successful. Precursor and hydrogen dilution flow rates of 1000 sccm and 2000 sccm are established, respectively and the precursor and hydrogen introduced to the chamber and hence aluminium nitride surface for a period of time that allows for the formation of a full, uniform monolayer of graphene on the aluminium nitride surface; in this example 450 seconds is ideal.

After completion of the graphene layer, the methane precursor flow is ceased, and the reactor is cooled under a continuing hydrogen flow of 2000 sccm at continuing low pressure, to preserve the graphene surface until suitable cooled, ideally to <100 C.

Example 25

In a similar process to Example 23, 2D material monolayer(s) can be produced on Gallium Nitride (GaN).

For example, selecting precursors such as trimethylgallium (TMGa) and ammonia gas ($NH_3$), the reactor is heated to a temperature such that the surface of the substrate (here sapphire or free-standing GaN) is greater than the required, or complete, decomposition temperature of the precursors, here >500 C. The reactor pressure is lowered to a suitable vacuum level to ensure evacuation of unwanted process by-products. For these precursors, a pressure of <600 mbar has proven successful. The TMGa, $NH_3$ and dilution flows of hydrogen are then introduced to the reactor through the inlets, and hence substrate surface at a suitable flow rate. In this example, 5000 sccm of $NH_3$, 100 sccm of TMGa and 15000 sccm of hydrogen are ideal. The precursors flow into the reactor for a period of time that allows the formation of gallium nitride material to a desired thickness. In this example, 1 hour is suitable for the deposition of 1.5 um of gallium nitride.

After completion of the gallium nitride layer, the TMGa flow is stopped, while the $NH_3$ flow and hydrogen flow continues. A hydrocarbon precursor, such as methane ($CH_4$), is selected for 2D material growth, in this case graphene. The reaction chamber temperature is changed such that the surface of the gallium nitride material is greater than the required, or complete, decomposition temperature of the 2D material precursor, here >1100 C. The reactor pressure is also changed to a suitable level to ensure evacuation of unwanted process by-products. For this hydrocarbon precursor in this heterostructure production process a pressure of <200 mbar has proven successful. The precursor flow is now set, along with the hydrogen dilution flow, to be 1000 sccm and 2000 sccm, respectively. The precursor is introduced to the chamber and hence gallium nitride surface for a period of time that allows for the formation of a full, uniform monolayer of graphene on the gallium nitride surface; in this example 320 seconds is ideal.

After completion of the graphene layer, the methane precursor flow is ceased, and the reactor is cooled under a continuing hydrogen flow of 2000 sccm and ammonia flow of 5000 sccm at continuing low pressure, to preserve the graphene surface until suitable cooled, ideally to <100 C.

Using similar methodologies to examples 23-25 graphene can be produced on semiconductor material surfaces using other graphene precursors.

Example 26

Using the same methodology as Example 23 boron nitride can be readily formed on a substrate. Graphene can then be produced on top of the BN surface using a halocarbon precursor, such as $CH_3Br$.

After completion of the BN layer, hydrogen dilution gas continues to flow into the reaction chamber at the aforementioned 2000 sccm, as in example 23. The reaction chamber temperature is changed such that the surface of the boron nitride material is greater than the required, or complete, decomposition temperature of the precursor, here >350 C. The reactor pressure is also changed to a suitable level to ensure evacuation of unwanted process by-products, and also high enough to facilitate the appropriate residency time of carbon products at the boron nitride surface to form graphene. For this halocarbon precursor, a pressure of 600 mbar has proven successful, as the main unwanted by-product, Br, has a vapor pressure higher than this at the selected decomposition temperature. The dilution gas is switched from hydrogen to nitrogen then the precursor and a dilution gas are then introduced to the reactor and hence substrate, through the chamber inlets, at a suitable flow rate, in this example 1000 sccm is ideal for $CH_3Br$ and 2000 sccm for nitrogen. Nitrogen is used in this process so as to limit the possible formation of HBr. The precursor and dilution gas flow through the reactor for a period of time that allows for the formation of a full, uniform graphene monolayer on the substrate surface, in this example 420 seconds is ideal. After completion of the layer, the precursor flow is ceased and the reaction chamber cooled under continuing nitrogen flow until the substrate and graphene layer are at a suitable low temperature, ideally <100° C.

Example 27

Similarly using the same methodology as Example 26 graphene can be formed on a BN surface using a suitable Metallocene precursor as a carbon source, for example $Cp_2Mg$ or $Cp_2Fe$. After completion of the BN layer, reactor conditions are changed for graphene deposition, whereby the substrate temperature is set to a level suitable for the decomposition of the precursor and preferential for surface kinetics suitable for graphene formation, here >500° C., and the reaction chamber pressure to a level preferential for graphene formation, here <200 mbar. Precursor and dilution flows are set to 700 sccm and 1300 sccm respectively and then introduced through the gas inlets to the reaction chamber and hence BN material surface. The precursor and dilution gas flow for a period allowing full graphene layer formation, here 380 seconds is ideal after which the precursor flow is stopped. The reaction chamber is cooled under continuing hydrogen flow until the substrate and graphene layer are at a suitably low temperature, ideally <100 C.

Example 28

The same methodology as Example 24 can be used to form aluminium nitride. Graphene can then be produced on top of the AlN surface using a halocarbon precursor, such as $CH_3Br$.

After completion of the AlN layer, hydrogen dilution gas continues to flow into the reaction chamber at the aforementioned 2000 sccm, as in Example 24. The reaction chamber temperature is changed such that the surface of the aluminium nitride material is greater than the required, or complete, decomposition temperature of the precursor, here >350 C. The reactor pressure is also changed to a suitable level to ensure evacuation of unwanted process by-products, and also high enough to facilitate the appropriate residency time of carbon products at the aluminium nitride surface to form graphene. For this halocarbon precursor, a pressure of 600 mbar has proven successful. The dilution gas is switched from hydrogen to nitrogen then the precursor and a dilution gas are then introduced to the reactor and hence substrate, through the chamber inlets, at a suitable flow rate, in this example 1000 sccm is ideal for $CH_3Br$ and 2000 sccm for nitrogen. The precursor and dilution gas flow through the reactor for a period of time that allows for the formation of a full, uniform graphene monolayer on the substrate surface, in this example 320 seconds is ideal. After completion of the layer, the precursor flow is ceased and the reaction chamber cooled under continuing nitrogen flow until the substrate and graphene layer are at a suitable low temperature, ideally <100° C.

Example 29

The methodology of Example 28 can be used to form graphene on a AlN surface using a suitable metallocene precursor as a carbon source, for example $Cp_2Mg$ or $Cp_2Fe$. After completion of the AlN layer, reactor conditions are changed for graphene deposition, whereby the substrate surface temperature is set to a level suitable for the decomposition of the precursor and preferential for surface kinetics suitable for graphene formation, here >500° C., and the reaction chamber pressure to a level preferential for graphene formation, here <200 mbar. Precursor and dilution flows are set to 700 sccm and 1300 sccm respectively and then introduced through the gas inlets to the reaction chamber and hence AlN material surface. The precursor and dilution gas flow for a period allowing full graphene layer formation, here 380 seconds is ideal after which the precursor flow is stopped. The reaction chamber is cooled under continuing hydrogen flow until the substrate and graphene layer are at a suitably low temperature, ideally <100 C.

Example 30

The same methodology as Example 25 may be used to form gallium nitride. Graphene can then be produced on top of the GaN surface using a halocarbon precursor, such as $CH_3Br$.

After completion of the GaN layer, hydrogen dilution gas and $NE1_3$ continue to flow into the reaction chamber at the aforementioned 15000 sccm and 5000 sccm respectively, as in example 25. The reaction chamber temperature is changed such that the surface of the gallium nitride material is greater than the required, or complete, decomposition temperature of the precursor, here >350 C. The reactor pressure is also changed to a suitable level to ensure evacuation of unwanted process by-products, and also high enough to facilitate the appropriate residency time of carbon products at the gallium nitride surface to form graphene. For this halocarbon precursor, a pressure of 600 mbar has proven successful. The dilution gas flow is reduced to 2000 sccm then the precursor and dilution gas are introduced to the reactor and hence substrate, through the chamber inlets, at a suitable flow rate, in this example 1000 sccm is ideal for $CH_3Br$. The precursor and dilution gas flow through the reactor for a period of time that allows for the formation of a full, uniform graphene monolayer on the substrate surface, in this example 320 seconds is ideal. After completion of the layer, the precursor flow is ceased and the reaction chamber cooled under continuing dilution gas flow until the substrate and graphene layer are at a suitable low temperature, ideally <100° C.

Example 31

Similarly using the same methodology as Example 30 graphene can be formed on a GaN surface using a suitable metallocene precursor as a carbon source, for example $Cp_2Mg$ or $Cp_2Fe$. After completion of the GaN layer, reactor conditions are changed for graphene deposition, whereby the reaction chamber temperature is set to a level suitable for the decomposition of the precursor and preferential for surface kinetics suitable for graphene formation, here >500°

C., and the reaction chamber pressure to a level preferential for graphene formation, here <200 mbar. Precursor and dilution flows are set to 700 sccm and 1300 sccm respectively and then introduced through the gas inlets to the reaction chamber and hence GaN material surface. The precursor and dilution gas flow for a period allowing full graphene layer formation, here 380 seconds is ideal after which the precursor flow is stopped. The reaction chamber is cooled under continuing hydrogen and $NH_3$ flow until the substrate and graphene layer are at a suitably low temperature, ideally <100 C.

Figure 4:
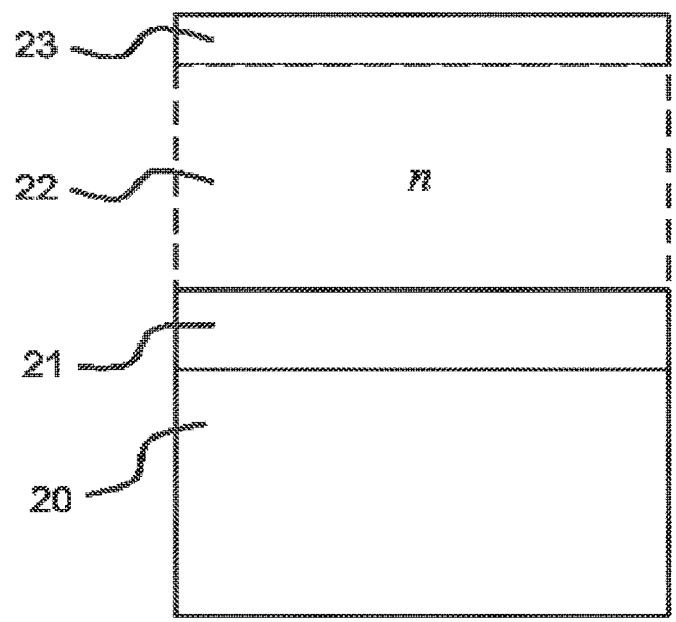

In a similar manner to Examples 23-30 above, 2D material layers can be produced on top of multilayered semiconductor heterostructures, directly after the production of the multilayered heterostructure, to form the surface layer of a semiconductor device, as shown schematically in FIG. 4 which illustrates a substrate 20 upon which is formed a heterostructure comprising n-time layers of semiconductor or dielectric material 22 with a 2D material surface layer 23. Optionally, a nucleation layer 21 may be provided between the substrate 20 and the first semiconductor or dielectric layer 22. Each individual semiconductor or dielectric material layer may have the same or different properties from its immediate neighbouring layers.

The deposition of the 2D material needs to be considerate of the preceding semiconductor structure, ensuring the process conditions employed to deposit the 2D layer do not detrimentally effect the underlying semiconductor materials or their interfaces.

Example 32

Surface contact layers for solid state light emitting devices can be produced by growing 2D layers on top of the semiconductor structure directly after producing the structure and in the same process.

For example a graphene contact layer can be deposited on a GaN based LED structure directly after completion of the semiconductor device structure. The deposition of GaN based LED structures, on sapphire and silicon substrates, is well known and the methodology widely available thus not described here as it is a lengthy procedure.

After completing the deposition of the GaN based structure it is essentially to preserve the surface of the material, thus an $NH_3$ flow is maintained to the reaction chamber, in this case of 4000 sccm, to ensure surface stability. Under this continuing $NH_3$ flow the reaction chamber conditions are changed to be suitable for the deposition of graphene, considerate of the selected graphene precursor. Using a graphene precursor of $CH_3Br$ the reaction chamber pressure is set to 550 mbar and the temperature to provide a structure top surface temperature of 850° C. As in Example 10 graphene is then deposited on the surface of the LED structure using the pulsed growth technique described above whereby $CH_3Br$ and a dilution gas, in this example nitrogen, are admitted to the reactor for a period of 15 seconds at flow rates of 1000 sccm and 5000 sccm respectively. The $CH_3Br$ flow is then paused for a period of 20 seconds, while still maintaining the nitrogen flux. The pulsing is repeated for a number of cycles to allow the formation of a uniform continuous graphene layer, however the number of cycles is highly dependent on the initial condition of the GaN device top layer, which can be highly changeable. Typically 5-8 cycles are good, but this can be substantially more. In-situ surface monitoring of the deposition, for example spectral reflectance measurement, is recommended in combination with real time process modification to achieve the desired result repeatedly. After completion of the graphene layer the reactor is cooled under mixed nitrogen $NH_3$ flows, at the levels previously stated until a reactor temperature of <450° C. is reached at which point the $NH_3$ flow is ceased and the reactor cooled to ambient under nitrogen flow only.

Example 33

2D layers can be employed as thermal dissipation layers for semiconductor devices by depositing the 2D material on top of the final device structure in the same process as the production of the semiconductor device. Consideration has to be applied when depositing the 2D layer to ensure the process does not detrimentally effect the semiconductor device, structure or individual layers.

For example, multi-layer graphene can be applied to a GaN based solid state high power electronic device top surface to act as a heat sink. The deposition of GaN based solid state electronics devices by VPE, on sapphire and silicon substrates, is well known and the methodology widely available thus not described here as it is a lengthy procedure. After completion of the semiconductor device an $NH_3$ flow is continued, in this example 4000 sccm, to maintain the GaN surface and the pressure and temperature changed to the conditions suitable for the deposition of graphene on the device top surface, in this example 600 mbar and 1150° C., for a precursor of $CH_4$. As in Example 11 a procedure of pulsing the $CH_4$ to the reactor is used whereby a flow of 1000 sccm is introduced for a period of 15 seconds, then ceased for 20 seconds, however in the period of $CH_4$ "off" a purge gas is introduced, in this case hydrogen, at a flow of 5000 sccm. This is repeated for 12 cycles, after which the reactor pressure is decreased to 300 mbar and the $CH_4$ flow increased to 1500 sccm. The pulse cycles are then repeated a further 12 times allowing the deposition of several graphene layers, in this example 3 layers. The reactor is then cooled under a combined $NH_3$ and hydrogen mixture to 450° C. at which point the $NH_3$ is stopped and the reactor cooled to ambient temperature.

This procedure requires modification considerate of the initial semiconductor device top surface condition, the device structure itself, for example are there limitations on temperature required to maintain the device structure and the number of graphene layers optimal for the structure.

Figure 5:
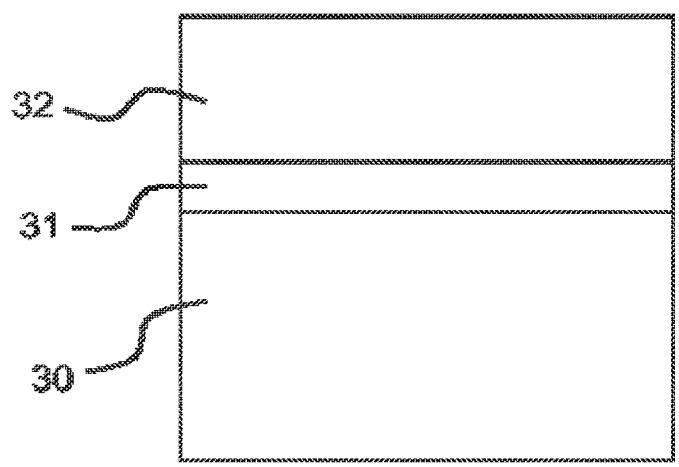

FIG. 5 illustrates a variant form of heterostructure that can be produced on a substrate 30 using the method of the invention. The heterostructure comprises a 2D material layer 31 upon which is formed a semiconductor or dielectric material 32.

Semiconductor growth on 2D materials is complicated by the need to promote lateral overgrowth, however applying variations of state of the art techniques used for the deposition of semiconductors on highly mismatched substrates it is possible to produce high quality semiconductor and dielectric materials on 2D layers.

Example 34

Dielectric Boron Nitride may be deposited on a graphene surface through the use of initial surface deposition processes that overcome the lattice mismatch of BN and graphene.

For example, graphene may be produced on a sapphire surface using one of the previous examples, in this case using the method outlined in Example 12. After completing the graphene layer the reaction chamber temperature and pressure are changed to give conditions that are suitable for the deposition of a nucleation process, in this example a substrate surface 1150° C. and 500 mbar respectively. Using the precursors NH$_3$ and triethylboron (TEB) boron nitride can be successfully deposited through a 3 stage process of nucleation, coalescing and bulk layer growth controlled by the VIII ratio (or NH$_3$:TEB ratio) of the precursors. Initially NH$_3$ and TEB are introduced to the (10:1 ratio) reaction chamber with flows of 1000 sccm and 100 sccm respectively for a period of 350 seconds. After which the VIII ratio is increased to 750 for another 350 seconds while also increasing the growth temperature to 1220° C. Subsequently the VIII ratio is increased further to 1500, for a period of 3600 seconds resulting in a BN layer of significant thickness, here ~25 nm. The precursor flows are stopped and the reactor cooled under a hydrogen purge flow, to maintain the material surface until ambient temperature is reached.

Example 35

In a similar method to Example 34 the semiconductor aluminium gallium nitride (AlGaN) can be deposited on a graphene layer.

For example, graphene is produced using the methodology outlined in Example 12, after completion of the graphene the reaction chamber conditions are changed to those preferential to the production of a semiconductor nucleation layer on the graphene surface, in this example a temperature of 1120° C. and pressure of 250 mbar. AlGaN can be successfully grown by first depositing an AN nucleation, or inter, layer on the graphene. Trimethyl aluminium (TMAl) and NH$_3$ are introduced to the reaction chamber with a dilution flow of hydrogen at 50 sccm, 50 sccm and 10000 sccm respectively for a period of 330 seconds, allowing a suitable nucleation layer thickness to be deposited, here ~10 nm. After completing the nucleation layer trimethyl gallium (TMGa) is additionally introduced to the reaction chamber at a flow rate suitable for the production of AlGaN at the desired mole fraction of Al, here 75 sccm TMGa is used. The precursors flow into the reaction chamber for a period allowing desired thickness of AlGaN to be deposited, in this example 7200 seconds to give ~1 µm of material. The precursors are then switched off and the reactor cooled under a hydrogen purge flow.

Example 36

In a similar method to Examples 34 and 35 the semiconductor gallium nitride can be deposited on a graphene layer.

For example, graphene is produced using the methodology outlined in Example 12, after completion of the graphene gallium nitride can be produced on the graphene through the application of a multistage process. First the reaction chamber conditions are changed to those preferential for the deposition of a wetting layer, in this example a pressure of 400 mbar and temperature of 1050° C. TMAl is then introduced at a flow rate of 20 sccm for a period of 200 seconds, after which an NH$_3$ flow of 50 sccm is introduced and the temperature increased to 1150° C. for a period of 300 seconds. The reactor is then cooled to 1000° C. and a flow of 100 sccm of TMGa added. The reactor is held at 1000° C. for 600 seconds then the temperature increased to 1050° C. while decreasing the pressure to 100 mbar and ceasing the TMAl flow and increasing the NH$_3$ flow to 9000 sccm. TMGa and NH$_3$ are flowed into the reaction chamber for a period to achieve the desired GaN film thickness, in this example 3600 seconds for ~2 µm. The TMGa is then stopped and the reactor cooled to <450° C. at which point the NH$_3$ is stopped and cooling completed under a hydrogen ambient.

Figure 6:
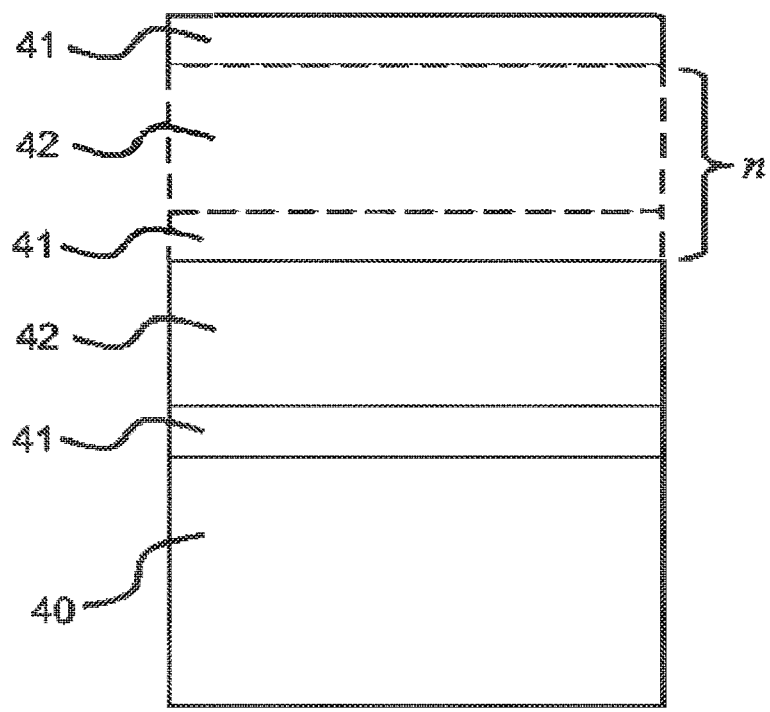

FIG. 6 illustrates a heterostructure comprising substrate 40 on which is formed a 2D layer 41 with a semiconductor or dielectric layer 42. This arrangement is repeated n-times; the heterostructure comprising a further top 2D layer 41 to form an electronic device such as a HEMT, LED or FET.

Each of the multiple semiconductor or dielectric layers 42 and 2D layers 41 may themselves comprise n-times layers with differing properties from layer to layer.

Example 37

Graphene can be utilized in an GaN based LED device structure to produce high performance contact layers for the final device whereby the graphene is produced as the first and last layer in the structure deposition.

For example, graphene is produced using the methodology outlined in Example 12, after completion of the graphene gallium nitride can be produced on the graphene through the application of a multistage process as outlined in Example 36. However, in this example GaN is deposited for a period of 600 seconds to produce a thin, stable GaN film upon which the following structure can be produced. After completion of this layer an LED structure, combined with graphene top layer, can be readily produced using the methodology outlined in Example 32.

The presence of a graphene lower layer makes removal of the structure from the substrate relatively simple, resulting in an LED device with transparent contact layers at the required electrical interfaces.

There follows a variant to the structure of FIG. 6 in which the order of the 2D layer and the semiconductor/dielectric layer is reversed.

Example 38

Graphene can be employed as an active channel in devices when produced in high quality form as part of a transistor structure.

For example, graphene can be produced on an MN surface using the methodology outlined in Example 29. Boron nitride can then be produced on the graphene surface using the technique outlined in Example 34, resulting in an ideal, graphene channel based transistor device structure.

This methodology has produced a simple transistor with channel properties of sheet resistivity of 45352/sq and Hall mobility of greater than 8000 cm$^2$/Vs with a carrier concentration of 10'2/cm2.

The Abstract is provided with the understanding that it is not intended be used to interpret or limit the scope or meaning of the claims. In addition, in the foregoing Detailed Description, various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The corresponding structures, materials, acts, and equivalents of all means or step plus function elements in the claims below are intended to include any structure, material, or act for performing the function in combination with other claimed elements as specifically claimed. The description herein has been presented for purposes of illustration and description, but is not intended to be exhaustive or limited to the examples in the form disclosed. Many modifications and variations will be apparent to those of ordinary skill in the art without departing from the scope of the examples presented or claimed. The disclosed embodiments were chosen and described in order to explain the principles of the embodiments and the practical application, and to enable others of ordinary skill in the art to understand the various embodiments with various modifications as are suited to the particular use contemplated. It is intended that the appended claims below cover any and all such applications, modifications, and variations within the scope of the embodiments.

Although specific embodiments of the subject matter have been disclosed, those having ordinary skill in the art will understand that changes can be made to the specific embodiments without departing from the scope of the disclosed subject matter. The scope of the disclosure is not to be restricted, therefore, to the specific embodiments, and it is intended that the appended claims cover any and all such applications, modifications, and embodiments within the scope of the present disclosure.

What is claimed is:

1. A method of producing multiple stacked graphene layers, the method comprising:
   providing a substrate comprising nucleation sites within a reaction chamber comprising at least one precursor entry point to provide a separation between the substrate surface upon which graphene is formed and the at least one precursor entry point;
   cooling the at least one precursor entry point;
   introducing at the at least one precursor entry point a precursor into the reaction chamber, the precursor being in a gas phase and/or suspended in a gas; and
   heating the substrate to a temperature that is within a decomposition range of the precursor, and that allows graphene formation from carbon released from the decomposed precursor to produce a first layer of graphene or doped graphene;
   followed by changing the temperature of the substrate and/or changing the pressure of the reaction chamber and/or changing the flow rate of precursor to form a further graphene layer or doped graphene layer on the first layer of graphene or doped graphene;
   wherein the distance between the surface of the substrate upon which the graphene is produced and the point at which precursor enters the chamber is less than 100 mm.

2. The method according to claim 1 further comprising sealing the reaction chamber after introducing the precursor to minimise or prevent flow of the precursor into or out of the reaction chamber.

3. The method according to claim 1 wherein the distance between the surface of the substrate upon which the graphene is produced and the point at which precursor enters the chamber is less or substantially equal to 20 mm.

4. The method according to claim 1 wherein the substrate provides a crystalline surface upon which the graphene is produced.

5. The method according to claim 1 wherein the substrate provides a non-metallic surface upon which the graphene is produced.

6. The method according to claim 1 wherein a mixture of the precursor with a dilution gas is passed over the heated substrate.

7. The method according to claim 6 wherein the dilution gas includes one or more from the list of hydrogen, nitrogen, argon and helium.

8. The method according to claim 1 further comprising introducing a doping element into the reaction chamber and selecting a temperature of the substrate, a pressure of the reaction chamber, and a gas flow rate to produce a doped graphene.

9. The method according to claim 8 wherein the precursor includes the doping element.

10. A method of producing graphene, the method comprising:
    providing a substrate comprising nucleation sites within a reaction chamber comprising at least one precursor entry point to provide a separation between the substrate surface upon which the graphene is formed and the at least one precursor entry point;
    cooling the at least one precursor entry point;
    introducing at the at least one precursor entry point a precursor into the reaction chamber, the precursor being in a gas phase and/or suspended in a gas; and
    heating the substrate to a temperature that is within a decomposition range of the precursor, and that allows graphene formation from carbon released from the decomposed precursor;
    wherein the distance between the surface of the substrate upon which the graphene is produced and the point at which precursor enters the chamber is less than 100 mm, and
    wherein the precursor includes one or more compounds from any one or more of the groups: hydrocarbon, hydride, halocarbon, including haloalkane and halo amides, metallocene, metalorganic, amine including alkylamines, organic solvents and azo compounds, and optionally azides, imides, sulphides and phosphides.

11. A method of manufacturing a heterostructure that includes graphene comprising an interface with a second layer, the method comprising:
    providing a substrate comprising nucleation sites within a reaction chamber comprising at least one precursor entry point to provide a separation between the substrate surface upon which the graphene is formed and the at least one precursor entry point;
    cooling the at least one precursor entry point;
    introducing at the at least one precursor entry point a precursor into the reaction chamber, the precursor being in a gas phase and/or suspended in a gas; and
    heating the substrate to a temperature that is within a decomposition range of the precursor, and that allows graphene formation from carbon released from the decomposed precursor;
    wherein the distance between the surface of the substrate upon which the graphene is produced and the point at which precursor enters the chamber is less than 100 mm, and
    wherein a first set of reactor conditions are used to produce graphene on the substrate within the reaction chamber; and
    further comprising introducing a second precursor under a second set of reactor conditions to form the second layer on the substrate.

12. The method according to claim 11 wherein the second layer comprises a film.

13. The method according to claim 11 wherein the second layer is a semiconductor.

14. The method according to claim 13 wherein the second layer comprises at least one of the following: GaN, BN, AlN, AlGaN, or SiN.

15. The method according to claim 11 wherein the separation between the substrate and a ceiling of the reactor chamber directly above the substrate is changed between forming the graphene and the second layer.

16. A method of producing graphene, the method comprising:
providing a substrate comprising nucleation sites within a reaction chamber comprising at least one precursor entry point to provide a separation between the substrate surface upon which the graphene is formed and the at least one precursor entry point;
cooling the at least one precursor entry point;
introducing at the at least one precursor entry point a precursor into the reaction chamber, the precursor being in a gas phase and/or suspended in a gas; and
heating the substrate to a temperature that is within a decomposition range of the precursor, and that allows graphene formation from carbon released from the decomposed precursor;
wherein the distance between the surface of the substrate upon which the graphene is produced and the point at which precursor enters the chamber is less than 100 mm, and
wherein the temperature drop between the substrate and the precursor entry point is greater than 10,000° C. per meter.

17. The method according to claim 1 wherein the precursor includes one or more compounds from any one or more of the groups: hydrocarbon, hydride, halocarbon, including haloalkane and halo amides, metallocene, metalorganic, amine including alkylamines, organic solvents and azo compounds, and optionally azides, imides, sulphides and phosphides.

18. The method according to claim 11 wherein the precursor includes one or more compounds from any one or more of the groups: hydrocarbon, hydride, halocarbon, including haloalkane and halo amides, metallocene, metalorganic, amine including alkylamines, organic solvents and azo compounds, and optionally azides, imides, sulphides and phosphides.

19. The method according to claim 16 wherein the precursor includes one or more compounds from any one or more of the groups: hydrocarbon, hydride, halocarbon, including haloalkane and halo amides, metallocene, metalorganic, amine including alkylamines, organic solvents and azo compounds, and optionally azides, imides, sulphides and phosphides.

20. The method according to claim 1 wherein the temperature drop between the substrate and the precursor entry point is greater than 10,000° C. per meter.

21. The method according to claim 10 wherein the temperature drop between the substrate and the precursor entry point is greater than 10,000° C. per meter.

22. The method according to claim 11 wherein the temperature drop between the substrate and the precursor entry point is greater than 10,000° C. per meter.

* * * * *